(12) United States Patent
Osawa et al.

(10) Patent No.: US 6,577,332 B2
(45) Date of Patent: *Jun. 10, 2003

(54) OPTICAL APPARATUS AND METHOD OF MANUFACTURING OPTICAL APPARATUS

(75) Inventors: Yasuhiro Osawa, Sendai (JP); Tetsuro Saitoh, Sendai (JP)

(73) Assignee: Ricoh Company, Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/151,968

(22) Filed: Sep. 11, 1998

(65) Prior Publication Data

US 2001/0012047 A1 Aug. 9, 2001

(30) Foreign Application Priority Data

Sep. 12, 1997 (JP) .............................................. 9-248088
Nov. 18, 1997 (JP) .............................................. 9-333599

(51) Int. Cl.⁷ ............................................... B41J 27/00
(52) U.S. Cl. ........................................ 347/241; 347/256
(58) Field of Search ............................... 347/241, 244, 347/238, 256, 257, 258; 257/98; 362/311

(56) References Cited

U.S. PATENT DOCUMENTS 3,991,339 A * 11/1976 Lockwood et al. ....... 257/98 X
4,698,730 A * 10/1987 Sakai et al. ................. 362/311
4,980,700 A * 12/1990 Ng .............................. 347/241
4,980,893 A * 12/1990 Thornton et al. ........ 347/238 X
5,055,892 A * 10/1991 Gardner et al. ........... 257/98 X
5,119,174 A *  6/1992 Chen ............................ 257/98
6,034,712 A *  3/2000 Iwasaki ....................... 347/241

FOREIGN PATENT DOCUMENTS

JP          7108709          4/1995
JP          8-1998           1/1996

* cited by examiner

Primary Examiner—Hai Pham
(74) Attorney, Agent, or Firm—Cooper & Dunham LLP

(57) ABSTRACT

An optical apparatus uses an array of light-emitting elements (LEDs or ELs) and a focusing optical system. Light emitted from the light-emitting elements of the array is directed to the focusing optical system within narrowed solid angles, thereby raising overall light utilization efficiency, with the help of recesses, each shaped as an inverted conical frustum, centered at respective light-emitting elements, to collect light from the light-emitting elements and deliver it to the focusing system within narrower solid angles, as both direct light and indirect light reflected from the slanting side walls of the recesses. The side walls of the recesses can have a reflecting film to further enhance overall light utilization efficiency. Lenses can be formed integrally with the array, to further help focus the light delivered to the focusing optical system.

38 Claims, 23 Drawing Sheets

OPTICAL APPARATUS AND METHOD OF MANUFACTURING OPTICAL APPARATUS

BACKGROUND

1. Field

The apparatus and method described in this patent specification relate to an optical apparatus, in particular, an optical apparatus using a light source in the form of a micro-light source array such as an LED (light emission diode) array or an EL (electroluminescence) array, etc., employed in the optical writing-in unit of a scanner, etc., or in an electrophotographic printer, a digital copying machine, a facsimile device, etc.

2. Background Technology

In recent years, there has been an increase in the use at home or in small businesses of office equipment that previously was found mainly in larger firms. As a result, there has been an increase in the demand for compact and low-cost office equipment such as electrophotographic printers, etc., that still provide high resolution and high print or copy quality.

One example of such apparatus is an LED printer, which is an electrophotographic printer employing an LED (light emitting diode) array comprising a large number of LEDs. Because a printer of such type uses a fixed writing light source incorporating the LED array, the apparatus itself can be more compact than a comparable raster scanning printer employing a semiconductor laser (laser diode) and a mirror scanning system. In addition, the LEDs in an LED printer can write in parallel (simultaneously) and thereby make it simpler to increase writing speed.

When the light source is an LED array, the light from the individual LEDs needs to be delivered onto the light-receiving surface (e.g., photosensitive or photoconductive surface) at high resolution and high efficiency. Furthermore, in order to make the apparatus more compact, the distance between the light source (LED array) and the light-receiving surface needs to be minimized. For this reason, a suitable focusing optical system is required. A rod lens array composed of bundled plural rod lenses has been used for such focusing in many LED printers.

FIG. 5 illustrates a structure discussed in the published specification of Japanese Laid-open Patent Publication No. 7-108709/1995, and is an example of an optical apparatus employing such a rod lens array in which light rays emitted from each of LEDs 102 in an LED array 101 (comprising a number of LEDs 102 arranged in a row extending in a direction perpendicular to the drawing sheet) are projected onto a photosensitive surface 105 by the focusing action of a corresponding rod lens 104 in the rod lens array 103 (which also comprises a number of lenses 104 arranged in a row extending in a direction perpendicular to the drawing sheet). As a result, a fine spot image is focused on the photosensitive surface 105. The rod lens array 103 forms the focusing optical system 106.

FIG. 22 is a similar cross-sectional view of the proposal discussed in the same Patent Publication, and shows that the light rays emitted from an LED 302 in an LED array 300 are projected onto a photosensitive surface 306 by the focusing action of a corresponding rod lens 304 in a rod lens array 103 to thereby produce a finely focused light spot at photosensitive material 306.

Another use of an LED array in an optical apparatus is illustrated in FIGS. 6 and 23, and is discussed in the published specification of Japanese Laid-open Patent Publication 8-1998/1996. In FIG. 6, light rays emitted from an LED 112 in an LED array chip (LED array) 111 are guided to a photosensitive surface facing or contacting an optically opaque block 114 through a corresponding light guiding path 113 in block 114, which is mounted on the LED array chip 111. In FIG. 23, light rays emitted from an LED 312 in an LED array 310 are guided to a photosensitive surface facing or contacting an optically opaque layer 314 through a corresponding guiding path 316 in the form of a light pipe formed in layer 314.

The rod lenses of a rod lens array system of the type illustrated in FIGS. 5 and 22, transmit light relatively efficiently to the photosensitive surface 105. However, because the light emission angle of an LED 102 in the LED array 101 is inherently wide and includes much more than the facing area of the corresponding rod lens 104, much of the light energy emitted from an LED does not reach its rod lens 104. As a result, there is poor utilization efficiency of the light energy that an LED emits. Consequently, if a predetermined amount of light energy or intensity is required at the photosensitive surface 105, it is necessary to emit much more energy or intensity from the LED, with a corresponding need for high drive electric current to the LED 102 and a corresponding undesirable heating of the LED 102.

The LED arrays of the type shown in FIGS. 6 and 23 also have a relatively poor light energy utilization and, in addition, fail to provide a light focusing function and, therefore, unless the photosensitive surface is brought very close to or in contact with the optical system (the layer 114), the light image formed on the photosensitive surface is out of focus, resulting in poor resolution.

SUMMARY OF THE DISCLOSURE

The system and method disclosed in this patent specification are designed to overcome these and other deficiencies in known approaches and to provide improvements in delivering light energy to a light receiving surface efficiently and effectively.

To this end, the disclosed system and method use a light source such as an LED or an EL array in an arrangement that increases the light energy utilization as compared with known systems and methods, while retaining significant benefits of such known systems and methods. One aspect of the disclosed approach is to use technology similar to that used in the integrated circuit (IC) technology to form an LED at the bottom of a recess whose walls serve to direct much more of the light energy from the LED to an element such as a rod lens that guides or some other focusing or light guiding system that in turn delivers the light energy to a light receiving surface.

BRIEF DESCRIPTION OF THE DRAWINGS

A more complete appreciation of the system and method disclosed in this patent specification and many of the attendant advantages thereof will be readily obtained as the same becomes better understood by reference to the following detailed description when considered in connection with the accompanying drawings, wherein.

DETAILED DESCRIPTION

Figure 1A:
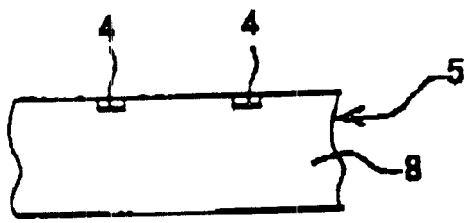
FIGS. 1(a) through 1(f) are elevational cross-sections illustrating an LED array head of a first embodiment disclosed herein, in the order of process steps of manufacturing the LED array head.

Referring now to the drawings, wherein like reference numerals designate identical or corresponding parts throughout the several views, a first through fifth embodiments are disclosed below, and methods of manufacturing them also are disclosed. The first embodiment is illustrated in FIGS. 1(a) through 1(f) and 2, the second embodiment in FIGS. 3(a) through 3(d) and 4, the third embodiment in FIGS. 7 through 13, the fourth embodiment in FIGS. 14 through 17, and the fifth embodiment in FIGS. 18 through 21.

First Embodiment

Figure 5:
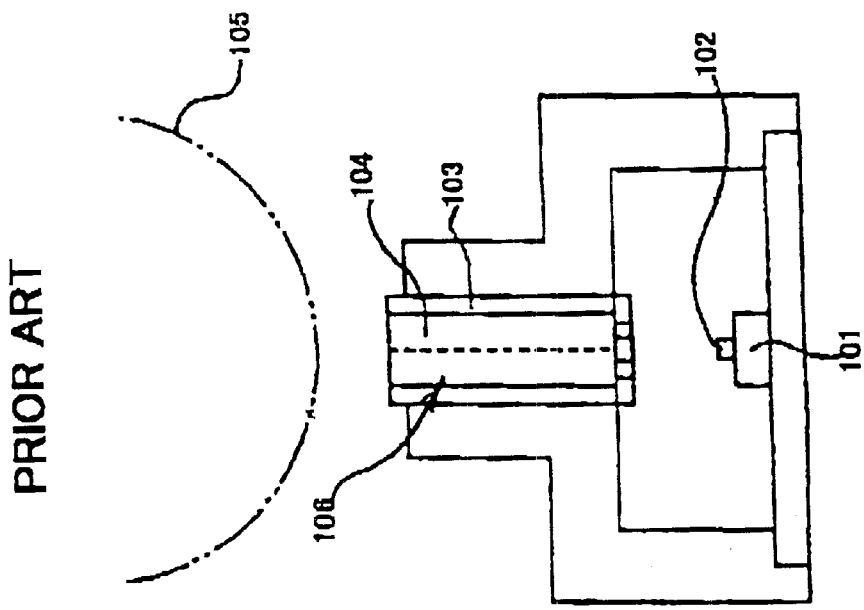
FIG. 5 is an elevational cross-section illustrating a known optical array apparatus utilizing a rod lens array.
Figure 6:
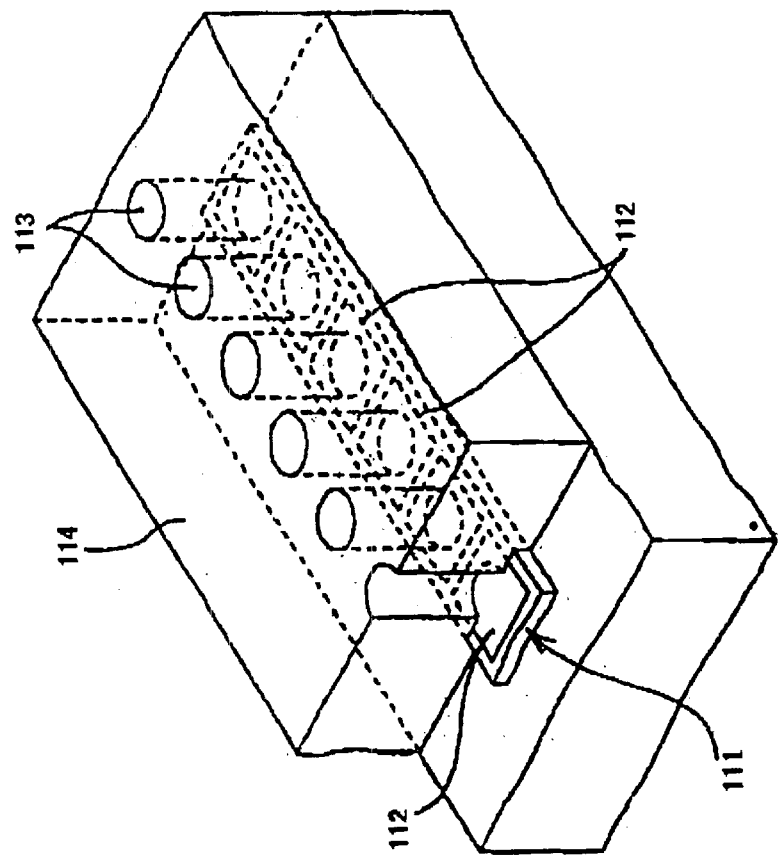
FIG. 6 is a perspective view illustrating a known optical apparatus using a light guide array to deliver light from LEDs.

The first embodiment, illustrated in FIGS. 1(a) through 1(f) and 2, is described, as a non-limiting example, as used for writing-in optical information through an image focusing optical system 1 comprising rod lens array, etc., that can be used in place of the focusing optical system 106 of FIG. 5.

Figure 2:
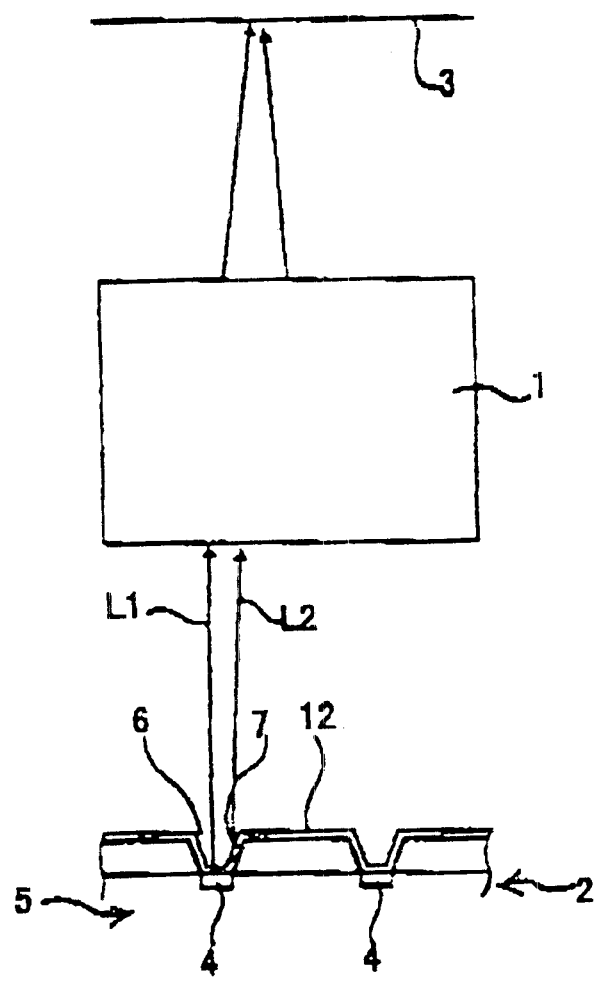
FIG. 2 is a schematic view of an optical apparatus using the LED array head of the first embodiment.

As seen in FIG. 2, such optical apparatus employs a structure in which the light emitted from an LED array head 2 is focused on a light receiving (e.g., photosensitive or photoconductive) surface 3.

Figure 1B:
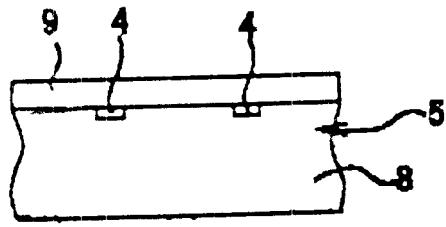
Figure 1C:
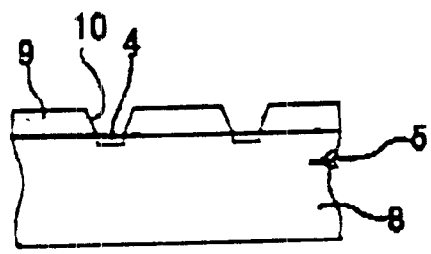
Figure 1D:
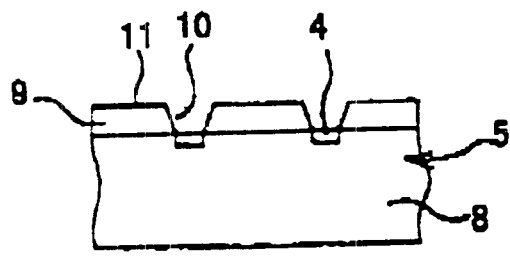
Figure 1E:
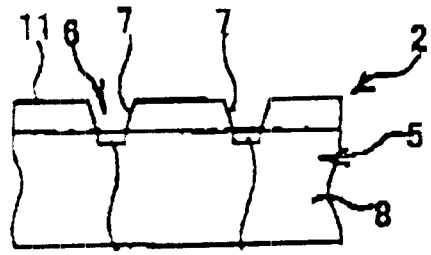
Figure 1F:
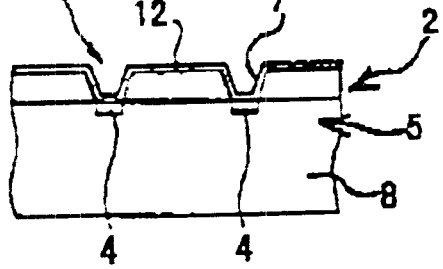

The LED array head 2 seen in FIG. 1(f) comprises LED array (light emitting element array) 5 in which plural LEDs 4 are employed as the light emitting element and are arranged in a row extending to the left and to the right. A reflection mirror 7 for each LED 4 serves as a respective optical system 6 narrowing the solid angle within which LED array 5 emits light from the LED 4.

The optical system 6 narrowing the solid angle of the emitted light is integratedly formed with the LED array 5. An exemplary and non-limiting method of manufacturing the optical system 6 is described below, referring to the elevational cross-sections of FIGS. 1(a) through 1(f) illustrating steps in the process of manufacturing the LED array 5.

At first, after LEDs 4 are formed in a substrate 8, a layer of polyamide 9 is formed over substrate 8 and LEDs 4, for use in forming the mirror structure. Preferably, layer 9 is approximately 25 μm thick. Refer to FIGS. 1(a) and 1(b).

Next, openings are formed, e.g., by etching, in layer 9 for a mirror structure 10. Each opening is in the shape of an inverted frustum (truncated cone) and is centered at a respective LED 4. Refer to FIG. 1(c). Preferably, the diameter of each frustum-shaped opening at the LED side (bottom side) of the mirror structure 10 is approximately 10 μm and the diameter of the light emission side thereof (top) is approximately 26 μm.

An aluminum reflection film 11 is formed over the mirror structure 10 to serve as a mirror reflection film. Refer to FIG. 1(d). The aluminum reflection film 11 which is over the LEDs 4 is removed but the film 11 is left in over the sides of the frustum-shaped openings of the mirror structure 10. Refer to FIG. 1(e). Thus, the reflection mirror 7 is formed over the surface surrounding and extending up from each respective LED 4. A protective film, such as an $SiO_2$ film 12, is formed over the entire surface of the mirror structure 10 to complete the LED array head 2.

Referring to FIG. 2, some of the light emitted from an LED 4 goes directly to the focusing optical system 1, as incident direct light L1. In addition, some of the light emitted from the same LED 4 reaches the focusing optical system 1 indirectly—after being reflected by the reflection mirror 7 surrounding and extending up from the LED 4—as incident indirect light L2. The focusing optical system 1 focuses the light it receives from an LED 4 onto the light receiving surface 3 as earlier discussed.

In this non-limiting example, if the focusing optical system 1 is 1 mm from the LED array head 2, the half-power width of the light spot from an LED onto the system 1 is approximately 550 μm, corresponding to a solid angle at the half-power level of approximately 31°. The term half-power refers to light intensity distribution level at which the power above and below that level is the same. The term half-power width refers to the width (diameter) of the light beam at that level.

If without using the reflection mirror 7 the solid angle at the half power level of the light from an LED is 65°, the use of the mirror 7 reduces that angle to about half, thus bringing about a substantial improvement. Furthermore, the efficiency of illuminating the light receiving surface 3 with the use of the reflection mirror 7 can be increased almost five-fold compared with the case of not using the reflection mirror 7, given that the focusing optical system 1 typically has an incident angle of nearly 20°, thus substantially improving the overall efficiency of the light from the light from the LED array 5.

Consequently, if the same light intensity is required at the light receiving surface 3 as in the known systems discussed above, the LED driving electric current that is required in the first disclosed embodiment can be reduced significantly because of the improved light utilization efficiency. As a result, the heating up of the LEDs 4 can be reduced. Conversely, if the LED drive current in the first embodiment is the same as in the known systems discussed above, the light intensity at the light receiving surface 3 can be significantly higher and, as a result, the exposure time can be significantly shortened and, thus, the scanning speed (writing-in speed) can be significantly decreased to thereby realize much higher-speed printing.

Furthermore, it is possible to provide the first embodiment structure, with its integration of the LEDs 4 and the reflecting mirror 7, using well developed thin film technology, thus realizing low cost production of the LED array 2.

Second Embodiment

The second embodiment is described hereinafter, referring to FIGS. 3(a) through 3(d) and 4. The elements that are the same as in the first embodiment bear the same reference numerals, and the description thereof is not repeated here. In the second embodiment, the optical system 21 for each of the LEDs 4 comprises a reflection mirror 7 and a focusing lens 22. The focusing lens 22 is formed integrally with the rest of the LED array 5, as is the reflection mirror 7.

A method of manufacturing the LED array head 23 of the second embodiment is described below, referring to the elevational cross-sections of FIGS. 3(a) through 3(d), where the reflection mirror 7 can be manufactured as discussed in connection with FIGS. 1(a) through 1(e).

In one non-limiting example, the diameter of the LEDs 4 is 10 μm and the diameter of the inverted frustum-shaped reflection mirror 7 also is 10 μm at its bottom, at the level of the LEDs 4. However, in order to form the focusing lens 22 of the second embodiment, the reflection mirror 7 differs in certain respects from that of the first embodiment.

Figure 3A:
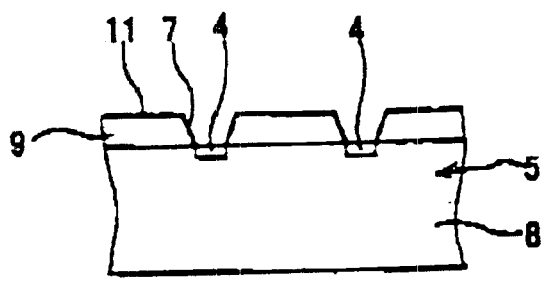
FIGS. 3(a) through 3(d) are elevational cross-section illustrating an LED array head of a second embodiment disclosed herein, in the order of process of manufacturing the LED array head.
Figure 3B:
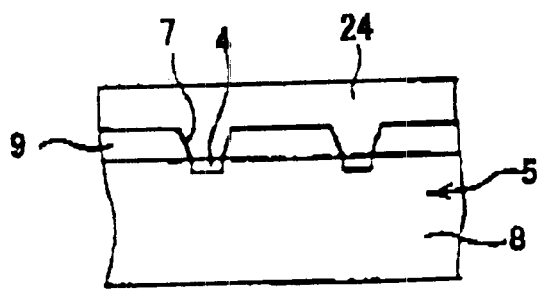
Figure 3C:
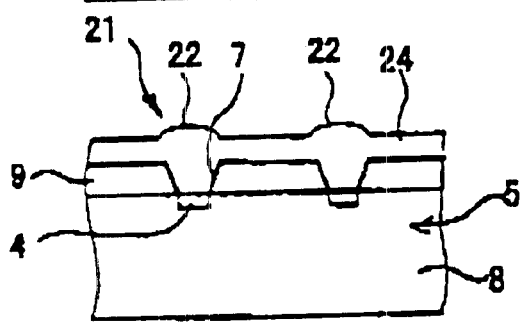
Figure 3D:
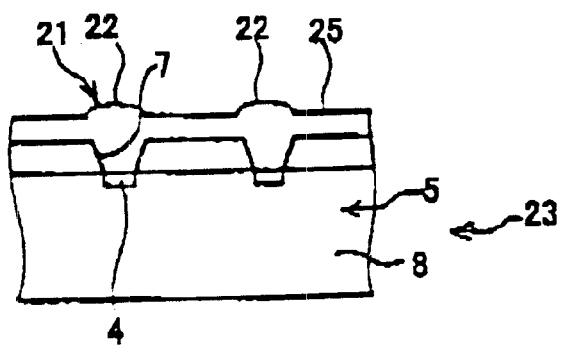

In order to form the LED array head 23 of the second embodiment, a layer of a transparent resin 24, preferably 75 μm thick, is formed over an array formed as discussed in connection with FIGS. 1(a) through 1(e), i.e., over the array illustrated in FIG. 1(f) that has been completed through the formation of the protective layer of SiO$_2$. Refer to FIG. 3(b). The refractive index of the transparent resin 24 preferably is 1.42. A plurality of focusing lenses 22 is formed over the SiO$_2$, e.g., by dry etching, each lens 22 centered at a respective LED 4. Refer to FIG. 3(c). Each focusing lens 22 is formed as an spherical lens conforming to a hyperboloid. The diameter of the lens 22 preferably is 40 μm, the radius of curvature at the apex of the lens preferably is 25 μm, and the circular cone coefficient preferably is −1.2934. Finally, a Cr film 25, opaque to light, is formed over the portion of the transparent resin film 24 outside the areas occupied by the focusing lenses 22. Refer to FIG. 3(d). This essentially completes the LED array head 23.

Figure 4:
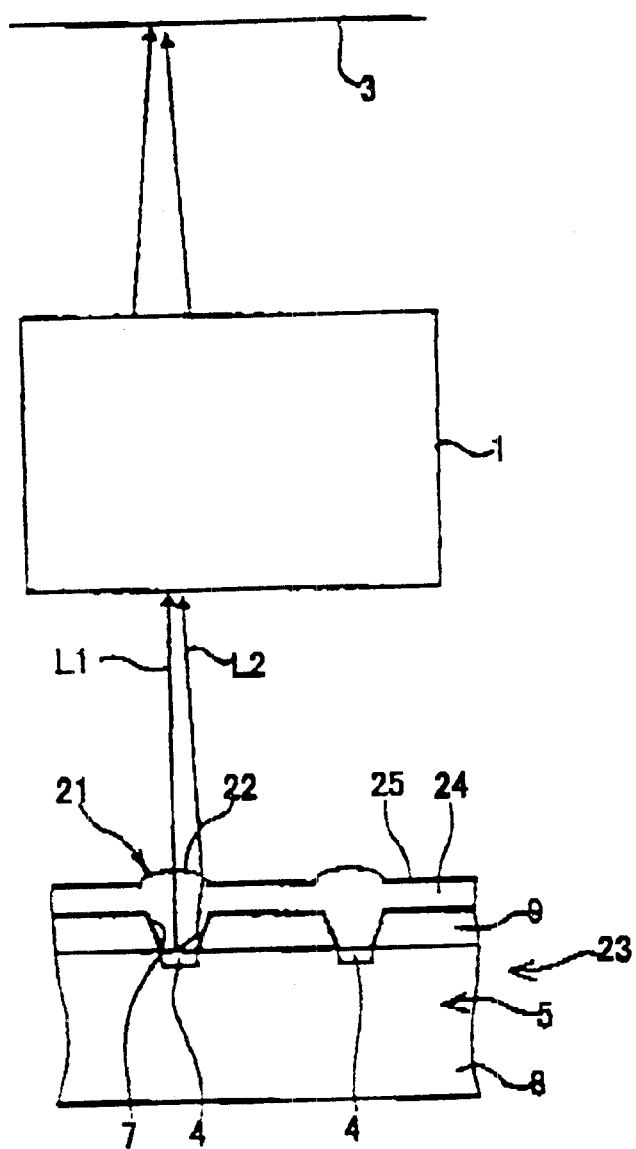
FIG. 4 is a schematic view of an optical apparatus using the LED array head of the second embodiment.

As seen in FIG. 4, some of the light emitted from an LED 4 goes directly to the focusing optical system 1, as incident direct light L1. In addition, some of the light emitted from the same LED 4 reaches the focusing optical system 1 indirectly—after being reflected by the reflection mirror 7 surrounding the LED 4, and after being focused by a lens 22—as incident indirect light L2. The focusing optical system 1 focuses the light it receives from an LED 4 onto the light receiving surface 3 as earlier discussed.

In the second embodiment, the reflection mirror 7 effects a reduction in the solid angle of the light an LED 4 emits, and the focusing lens 22 effects a further reduction in the solid angle of the light delivered to the optical system 1 that in turn further focuses the light onto the light receiving surface 3.

For instance, if the focusing optical system 1 is 1 mm from the LED array head 2, the half-power width of the light from an LED 4 at the optical system 1 is approximately 150 μm. This width corresponds to a half-power level solid angle of approximately 9°.

Thus, the addition of the focusing lens 22 further improves efficiency as compared with the first embodiment, through further harrowing the solid angle of the light from an LED that is delivered to the optical system 1 and the light receiving surface 3. As compared with the known technology earlier discussed, that does not use a reflection mirror 7 or a lens 22, the second embodiments provides a ten-fold increase in illumination.

Third Embodiment

Figure 7:
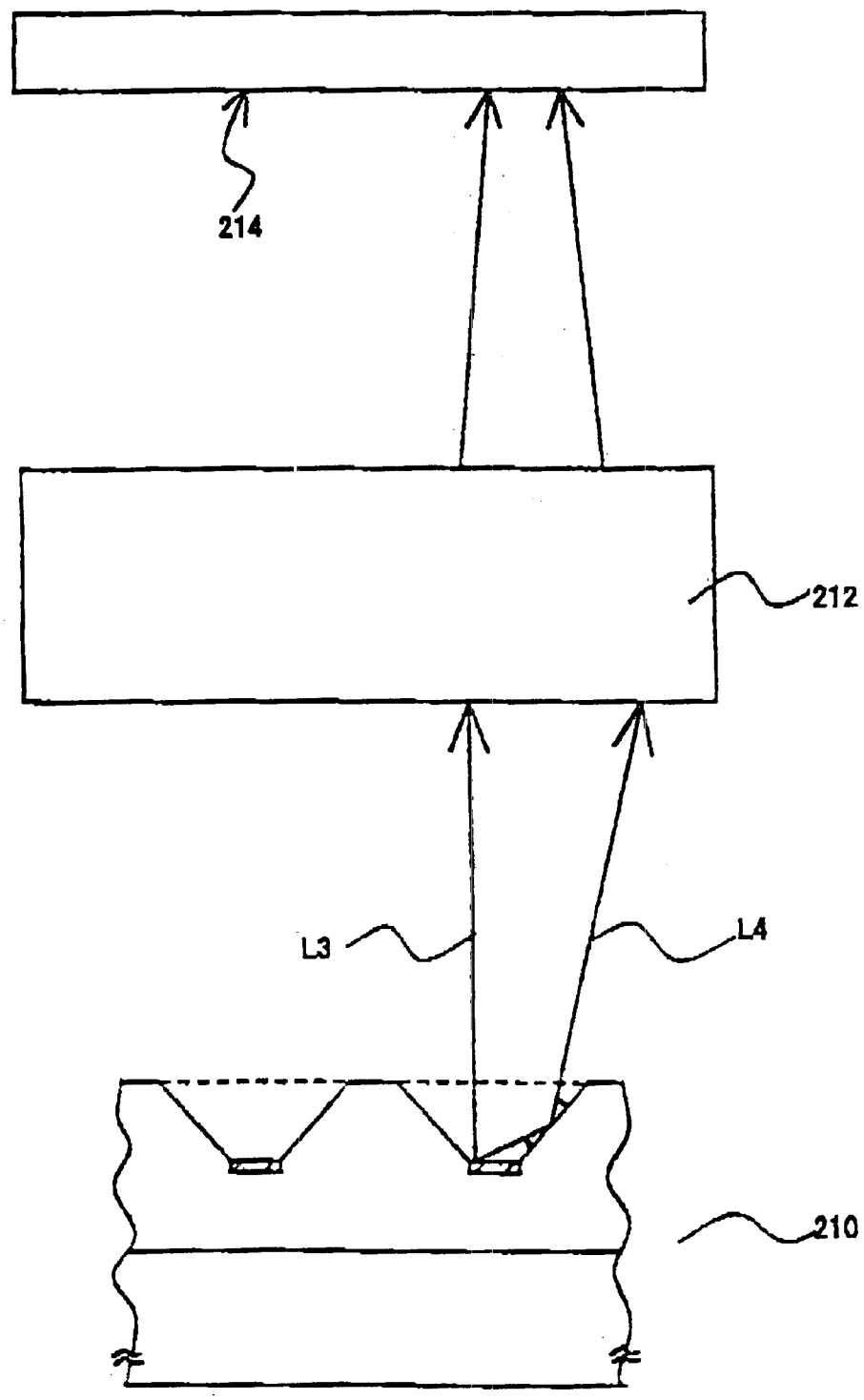
FIG. 7 is a schematic view of an optical apparatus using a third embodiment disclosed herein.
Figure 8:
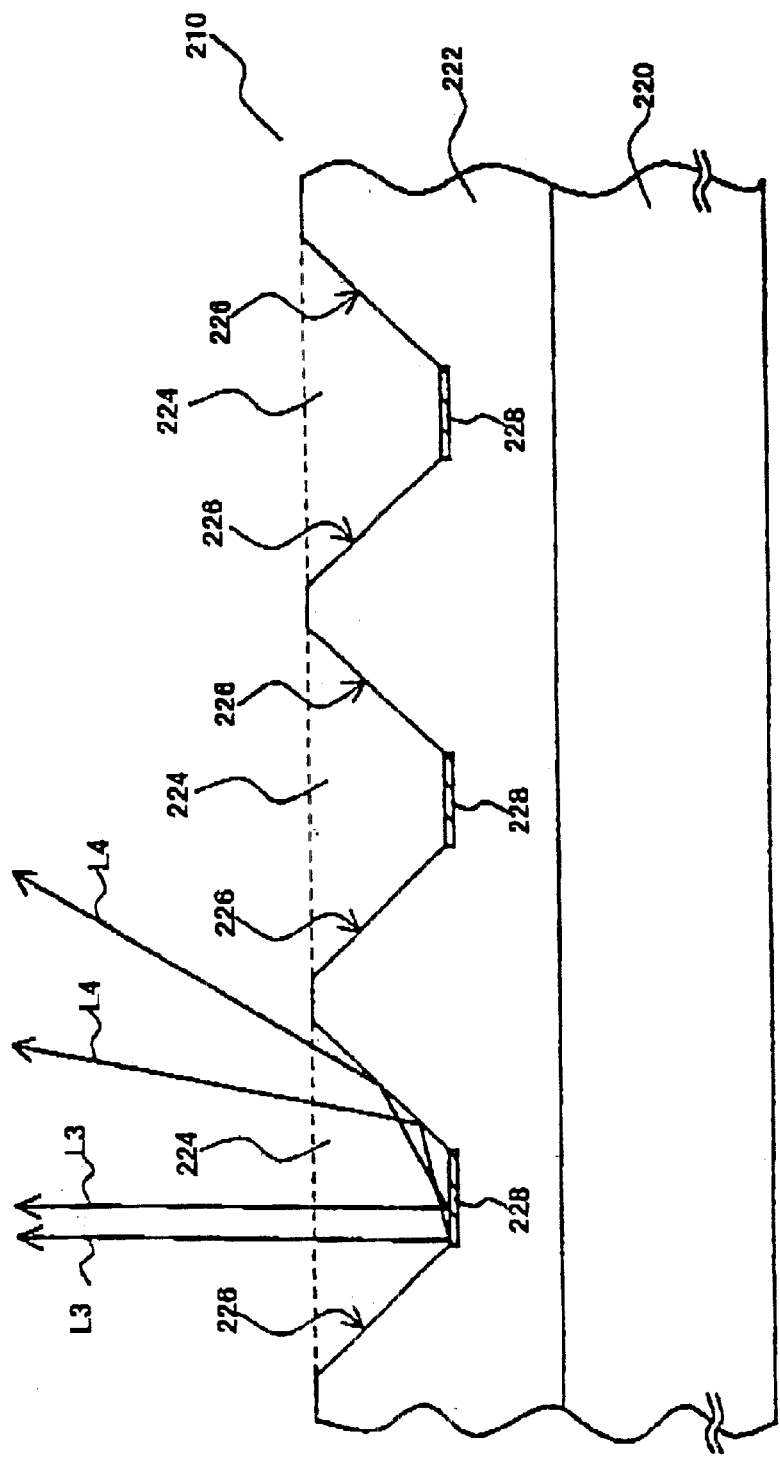
FIG. 8 is a cross-section illustrating an LED array of the third embodiment.
Figure 9:
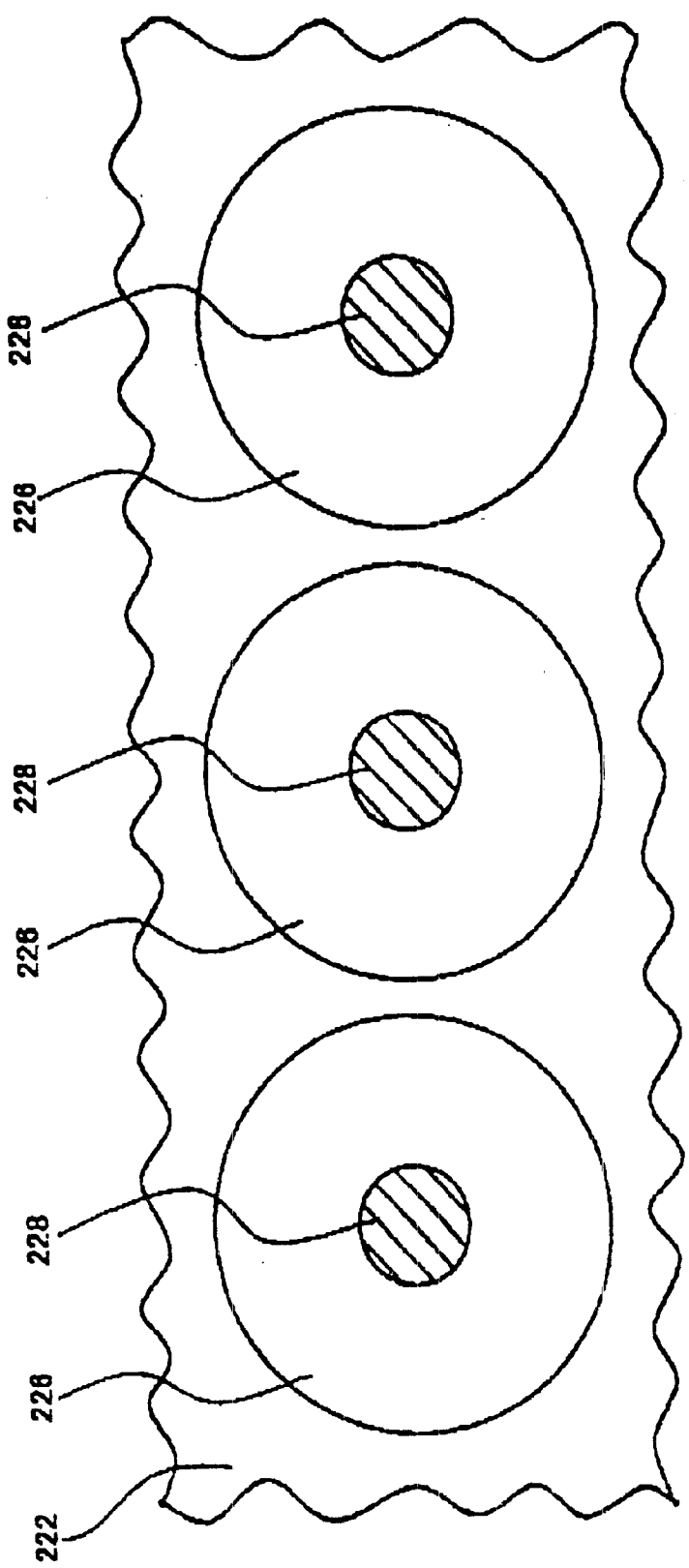
FIG. 9 is a plan view of the LED array shown in FIG. 8.

FIG. 7 schematically illustrates an optical apparatus using the third embodiment's LED array, FIG. 8 is a cross-section illustrating the third embodiment's LED array, FIG. 9 is a plan view of the LED array of FIG. 8, and FIGS. 10 through 13 are cross-sections illustrating steps in a process of manufacturing the LED array of FIG. 8.

As seen in FIG. 7, the third embodiment's LED array can be used, as a non-limiting example, in a writing-in optical apparatus of an LED printer. Light emitted from an LED array 210, in the form of direct light L3 and indirect (reflection) light L4, impinges of a light focusing system 212 light, and the focused light emerging from focusing system 212 impinges on a light-receiving surface 214, e.g., a photosensitive or a photoconductive surface or some other type of a light receiving surface.

Next, the structure of the LED array 210 is described below.

As seen in FIGS. 8 and 9, an n-type GaAs layer 222, such as an epitaxial layer, is formed over a substrate such as a GaAs substrate 220. Recesses 224 are opened from the top of layer 222, each shaped as an inverted frustum (truncated cone). Each recess 224 preferably has a circular bottom of radius 5 μm. The circular opening of a frustum at the top of layer 222 preferably has a radius of 10 μm, and the depth of the inverted frustum preferably is 20 μm. The side wall of the recesses 224 is a slanted surface 226.

To form LEDs 228 of the LED array 210, the n-type GaAs at the circular bottom of each inverted frustum 224 is doped with an impurity such as Zn to p-type polarity to thereby form an LED 228 at the bottom of each recess 228. Furthermore. electrodes (not shown) are formed for supplying electric current to the light-emitting portions 228.

Next, the operation of the LED array 210 is described. As each light-emitting portion 228 of the LED array 210 is a circle of radius 5 μm, it need not be regarded as a point source but can be considered a source that emits light from each of a number of laterally spaced point sources within a single portion 228. The light that a light emitting portion 228 emits can be considered diffused light emitted within a solid angle of 120° at the half-power level.

The recesses surrounding the light-emitting portion 228 of the LED are spreading out in the shape of the reversed circular cone frustum just like the cocktail glass from the light-emitting portion 228 of the bottom surface portion toward the opening portion, that is, the light-emitting side of the surface of the n-type GaAs epitaxial layer 222.

Thus, light from a light-emitted portion 228 reaches the focusing optical system 212 as direct incident light L3, and additional light from the same portion 228 reflects from different portion of the inclined surface 226 of the side wall of the recess 224 and reaches the system 212 as indirect (reflected) light L4. The slanted surface 226 of the side wall of each recess 224 acts as mirror reflecting light emitted from its respective light-emitting portion 228, and the slanted surface 226 thus serves to narrow the solid angle within which light reaches the optical system 212.

Next, a method of manufacturing the third embodiment's LED array 210 is described hereinafter, referring to FIGS. 10 through 13.

Using a process such as epitaxial growth, the n-type GaAs layer 222 is formed over the GaAs substrate. Thereafter, using a process such as photolithography, a mask 230 is patterned over the n-type GaAs epitaxial layer 222 to expose the layer 222 where the recesses 224 will be formed and protect it elsewhere.

Figure 10:
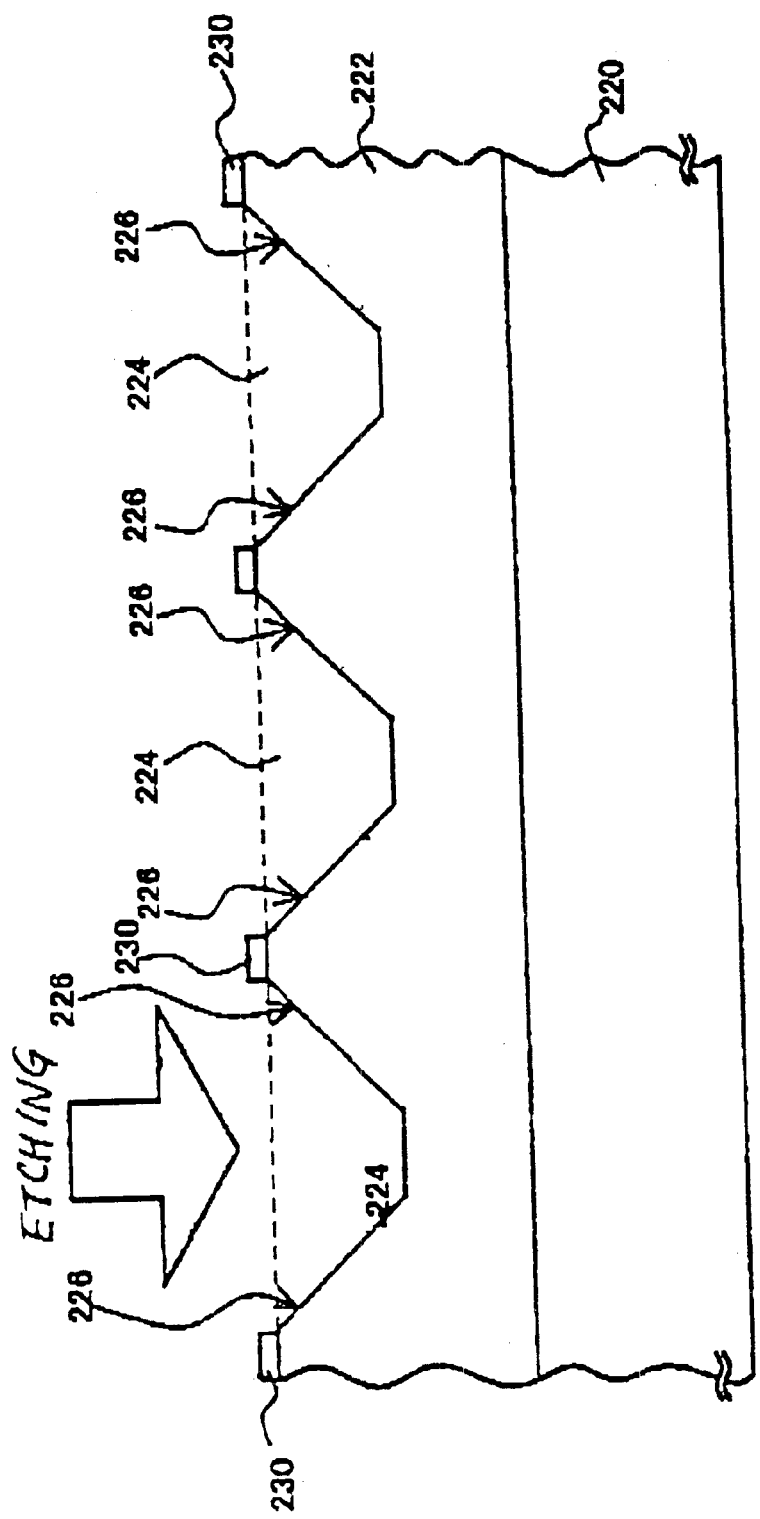
FIG. 10 is a cross-section illustrating a first step in the manufacture of the LED array of FIG. 8.

Using the mask 230, the n-type GaAs epitaxial layer 222 is selectively etched to form the recesses 224, each shaped as an inverted frustum (truncated cone) approximately 20 $\mu$m deep and with a circular bottom of a 5 $\mu$m radius. The side wall of each recess is a slanted surface 226 in vertical section. Refer to FIG. 10.

Figure 11:
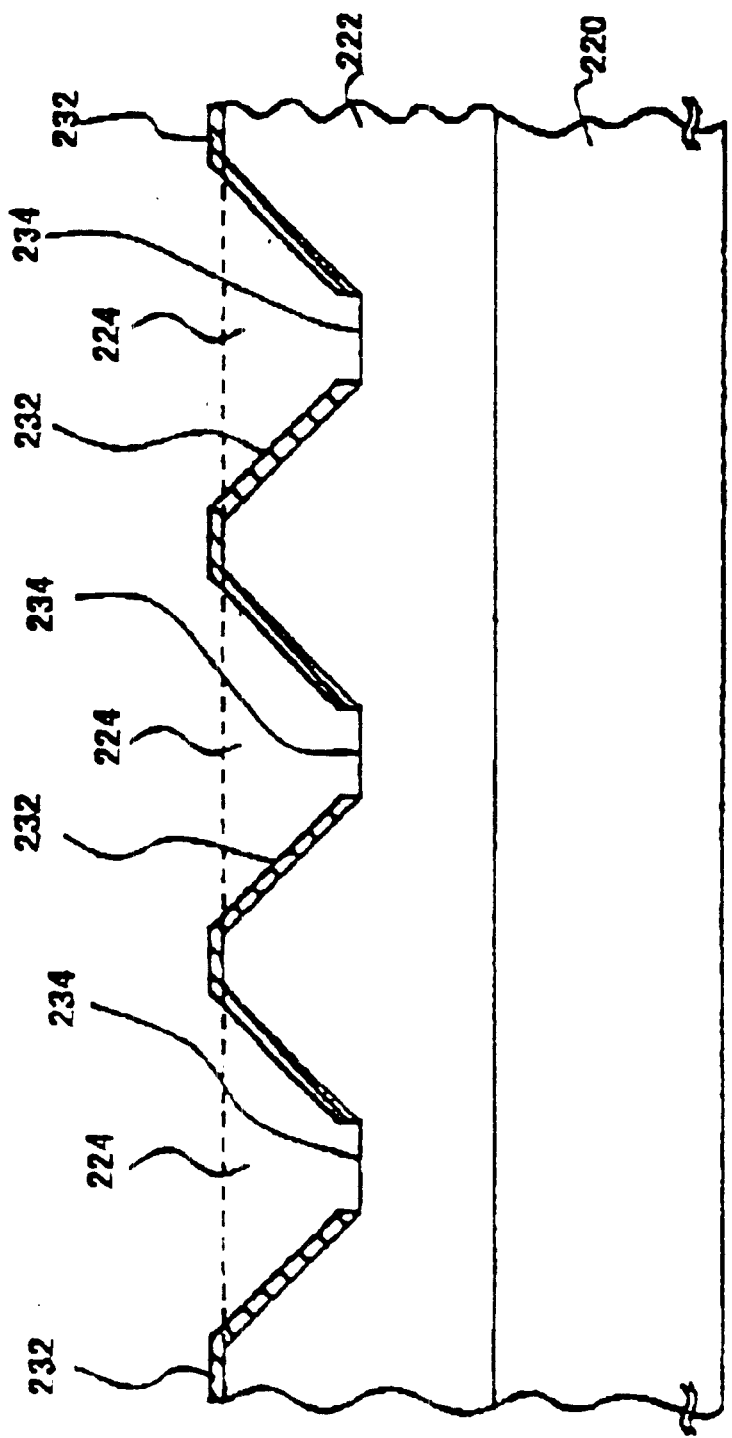
FIG. 11 is a cross-section illustrating a second step in the manufacture of the LED array of FIG. 8.

Following the formation of recesses 224 (and possible removal of the mask 230), an insulation film 232 of a material such as SiO$_2$ is formed over the entire exposed surface of the layer 222. Using a process such as photolithography and etching process, the SiO$_2$ insulation film 222 is selectively removed from the bottoms 234 of the recesses 224. Refer to FIG. 11.

Using a process of introducing impurities, such as a diffusion process utilizing the remaining portions of the SiO$_2$ insulation film 232 as a diffusion mask, the exposed portions of the layer 222 are doped to p-type polarity with dopants such as Zn, to thereby form p-type portions 228 at the bottoms of the recesses 224.

Figure 12:
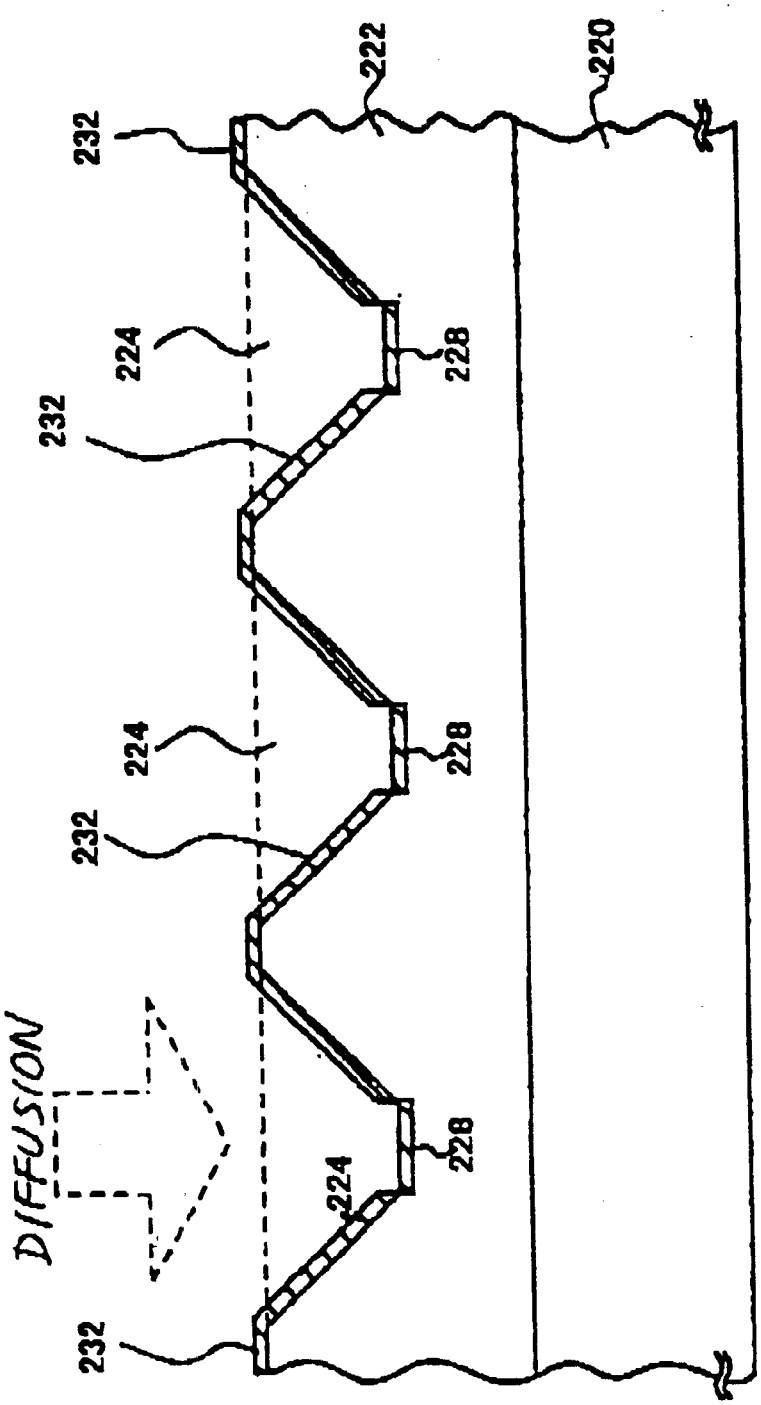
FIG. 12 is a cross-section illustrating a third step in the manufacture of the LED array of FIG. 8.

Thus, LEDs 4 having a pn junction part between the n-type GaAs layer 222 and the p-type GaAs portions 228 are formed. Refer to FIG. 12.

Figure 13:
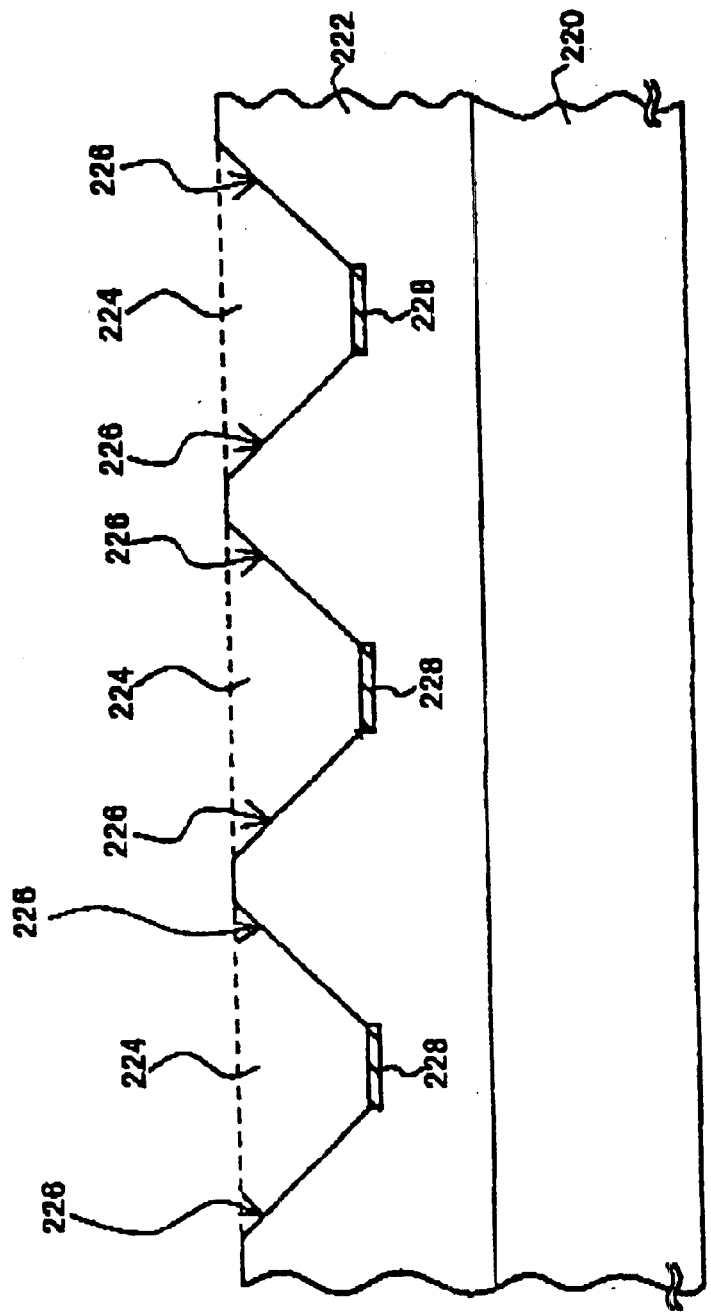
FIG. 13 is a cross-section illustrating a fourth step in the manufacture of the LED array of FIG. 8.

The remaining portions of the SiO$_2$ insulation film 232 are removed, and electrodes (not shown) are formed for supplying electric current to the light-emitting portions 228, essentially completing the LED array 210 seen in FIG. 8. Refer to FIG. 13.

In an optical system using the third embodiment's LED array 210, the light-emitting portions 228 of the respective LEDs are at the bottoms of the recesses 224 into the surface of the n-type GaAs epitaxial layer 222. Each recess 224 surrounds a respective light-emitting portion 228 and is in the shape of an inverted frustum (truncated cone) centered at a corresponding light-emitting portion 228. The slanted surface 226 of the side wall of the recesses 224 acts as a mirror reflecting light emitted from the light-emitting portion 228 of the LED toward the optical focusing system 212, thereby narrowing the solid angle at which light from an LED reaches system 212. The reflection optical system for narrowing this solid angle is integratedly formed as a part of the LED array 210.

When each LED light-emitting portion 228 is a circular surface and has a radius of 5 $\mu$m, the light emitted from the light-emitting portion 228 approximates diffused light emitted within a solid angle of 120° at the half-power level but the reflection from the slanted side surface of the corresponding recess 224 effectively reduces the solid angle of the light the LED delivers to the focusing system 212 as direct incident light L3 and indirect incident light L4. Consequently, the third embodiment increases the overall light utilization efficiency as compared with the known systems discussed earlier.

Because the light-emitting portion 228 of the LED and the GaAs layer 222 have substantially the same thermal expansion coefficient, as they are both the same GaAs material doped with different dopants, the third embodiment effectively avoids undesirable thermal effects such as thermal stress that could distort the reflections from the side surface of the recesses 224, even if the operational temperature of the light-emitting portion 228 rises.

Furthermore, when the light-emitting portions 228 of p-type GaAs layer are formed by introducing dopants such as Zn into the n-type GaAs layer 222 using a diffusion process, the SiO$_2$ insulation film 232 covering the top surface of the n-type GaAs epitaxial layer 222 and the slanted surface 226 on the side wall of the recesses 224 can serve as the diffusion mask, and thereby accurately position the portions 228 relative to the recesses 224 and reduce manufacturing cost while improving performance.

Fourth Embodiment

Figure 14:
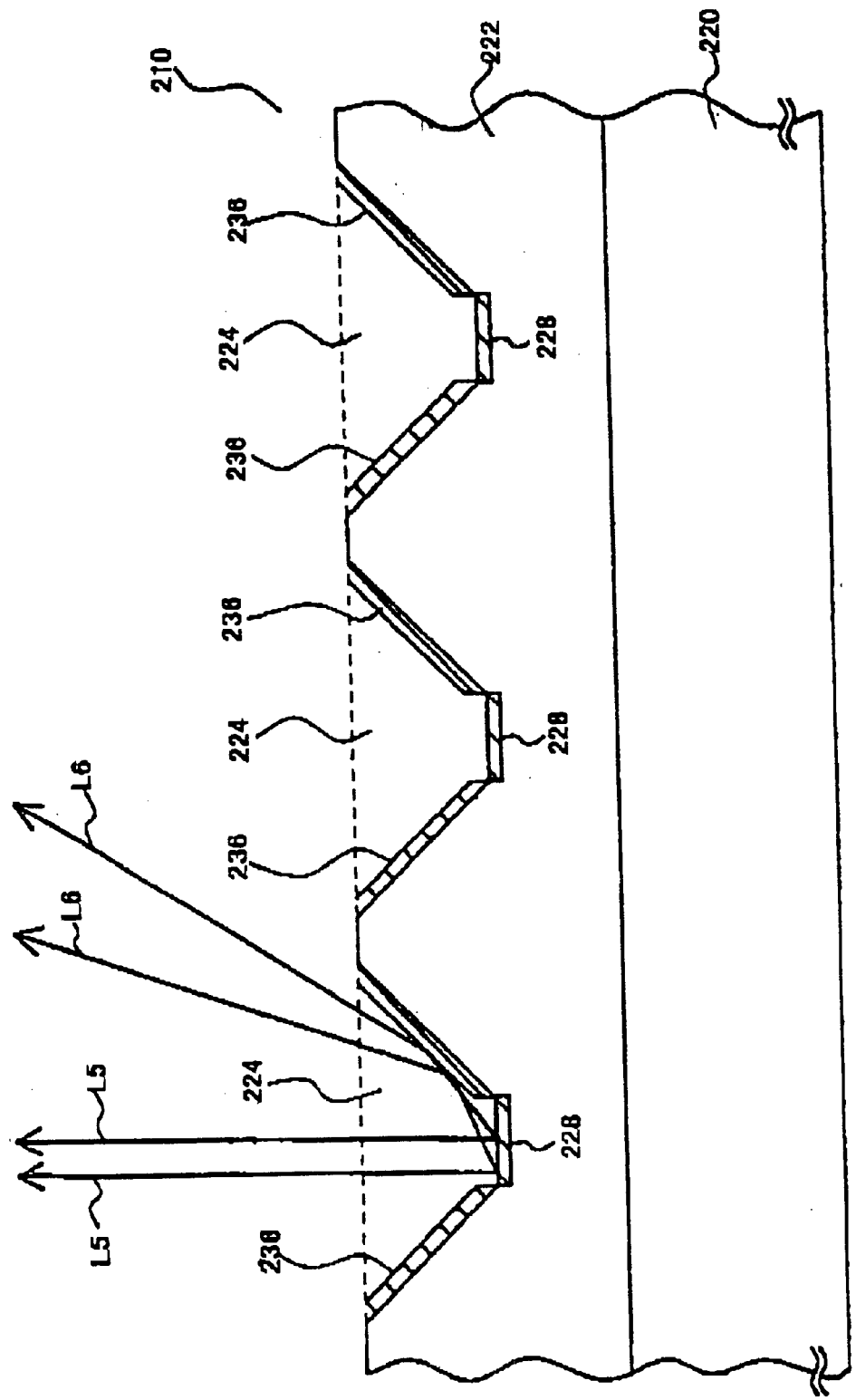
FIG. 14 is a cross-section of an LED array illustrating a fourth disclosed embodiment.
Figure 15:
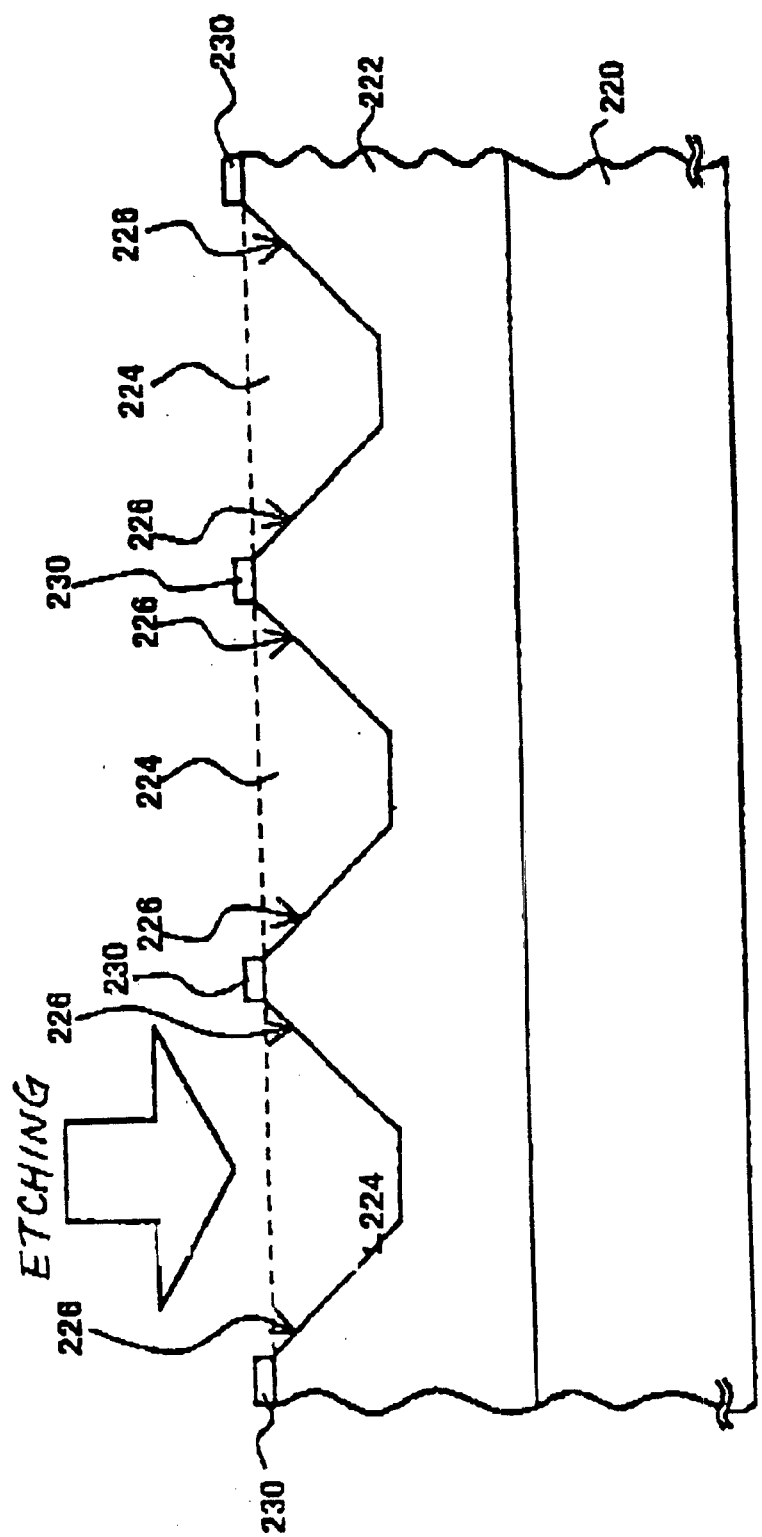
FIG. 15 is a cross-section illustrating a first step in the manufacture of the LED array of FIG. 14.
Figure 16:
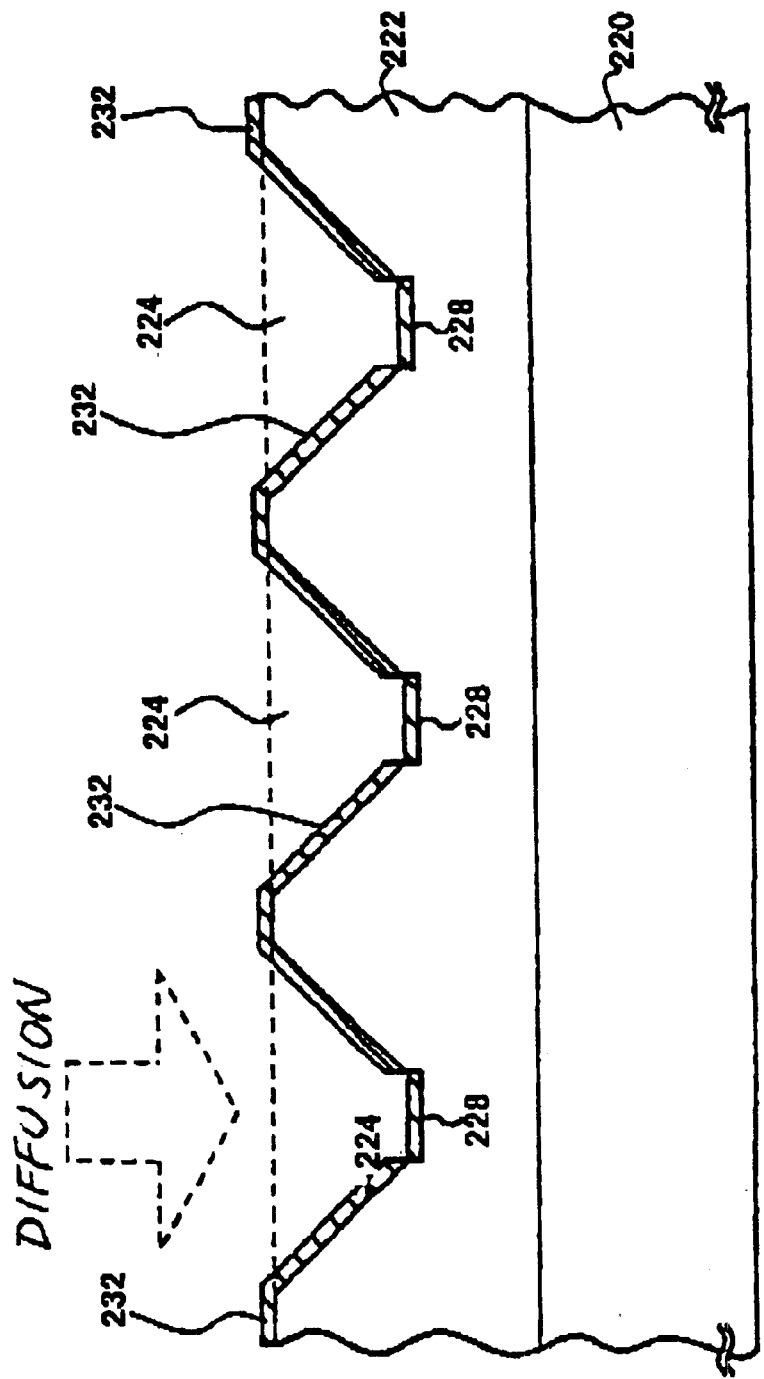
FIG. 16 is a cross-section illustrating a second step in the manufacture of the LED array of FIG. 14.
Figure 17:
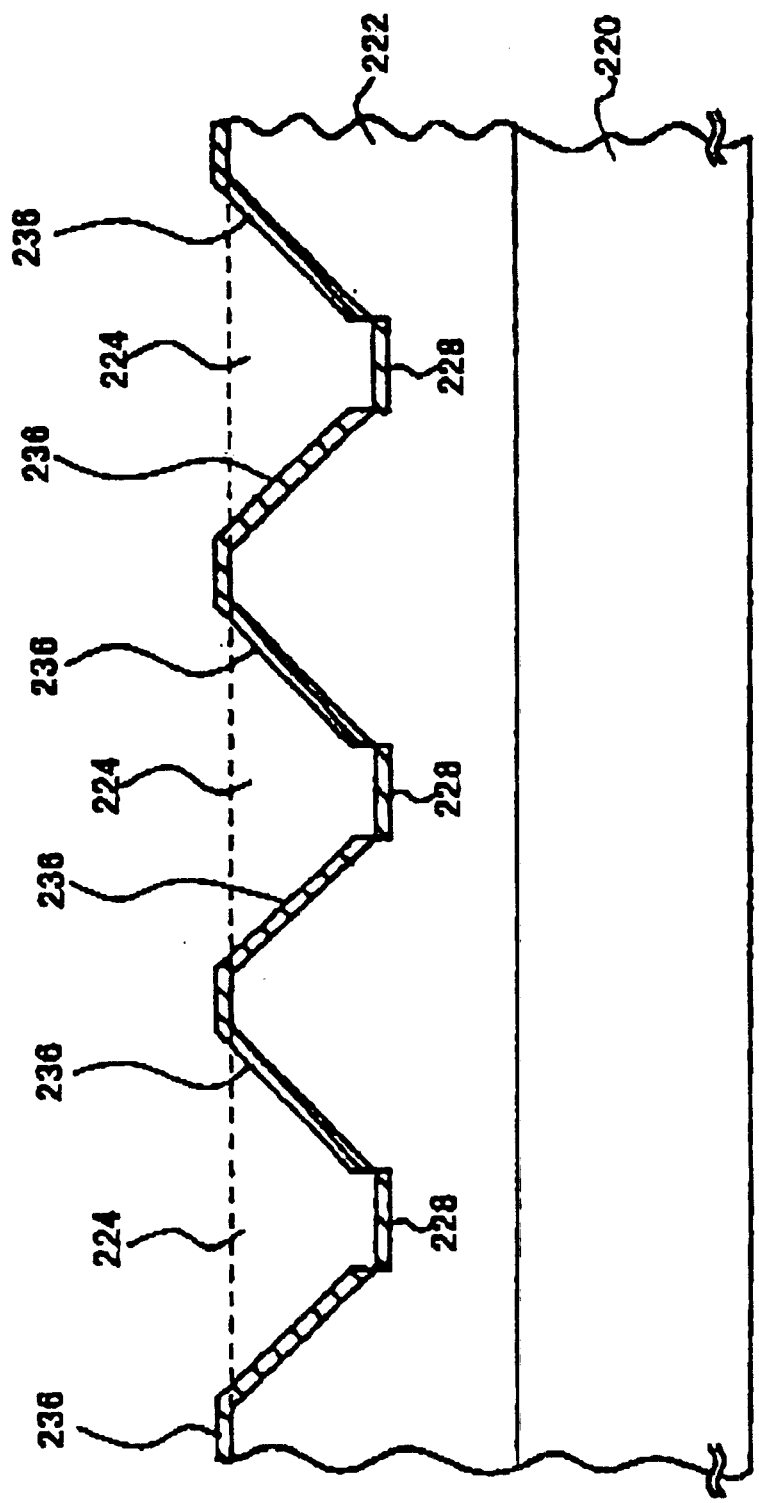
FIG. 17 is a cross-section illustrating a third step in the manufacture of the LED array of FIG. 14.

FIG. 14 is a cross-section illustrating the structure of an optical apparatus using the fourth embodiment, and FIGS. 15 through 17 are cross-sections illustrating steps in a method of manufacturing the LED array of FIG. 14.

As a non-limiting example, an optical apparatus using the fourth embodiment can be employed for writing-in optical information in a device such as an LED printer, as can an optical apparatus using the third embodiment. Because of the similarities with the third embodiment illustrated in FIG. 7, the same reference numerals are used for like elements in FIGS. 14–17 as in FIGS. 7 through 13, and the description thereof is not repeated here.

The structure of the LED array 210 used in the fourth embodiment is described hereinafter.

As seen in FIG. 14, a GaAs layer 222 of one polarity, for instance, n-type GaAs, is formed, for example as an epitaxial layer, over a GaAs substrate 220, and recesses 224 are formed into layer 222, each in the shape of an inverted frustum (truncated cone). Each recess 224 preferably has a circular bottom whose radius is 5 $\mu$m. The top of a recess 224 preferably is the shape of a circular opening of a 10 $\mu$m radius, and the depth of a recess 224 preferably is 20 $\mu$m. Each recess 224 has a slanted side wall 226 in vertical section.

Portions 228 of opposite polarity, for example p-type, are formed at the circular portions of the GaAs layer 222 exposed at the bottoms of the recesses 224, for example by introducing a dopant such as Zn, to thereby form light-emitting portion 228 serving as LEDs. Electrodes (not shown) are formed to supply electric current to the light-emitting portions 228.

In the fourth embodiment, Au/Cr film 236 is formed on the slanted surface 226 of the side wall of each recesses 224. A Cr film is interposed between the GaAs and the Au in order to improve bonding between the Au film, which has a high reflection coefficient, and the underlying n-type GaAs epitaxial layer 222.

Next, the operation of the LED array 210 is described hereinafter.

As seen in FIG. 14, the light-emitting portion 228 of an LED emits light at its entire upper surface, which light can be considered as approximating diffused light emitted within a solid angle of 120° at the half-power width. The recess 224 surrounding the light emitting portion 228 of an LED, restricts the light to a lesser solid angle, and the Au/Cr film 236 serves as a reflection film.

Due to this structure, light from an LED area 228 is directed up, toward an optical focusing system (as to system 212 in FIG. 7) as direct incident light L5 and as indirect incident light L6 that is reflected from the Au/Cr film 236 on the slanted side wall of the recess 224. The recess 224 and the Au/Cr film 236 thus serve to reduce the solid angle within which light from a light-emitting portion 228 is directed up to the optical focusing system and therefrom to a light receiving surface (such as surface 214 in FIG. 7).

Next, a method of manufacturing the LED array 210 is described hereinafter, referring to the cross-sections of FIGS. 15 through 17.

After forming the n-type GaAs epitaxial layer 222 over the GaAs substrate 220, a mask 230 is patterned over the n-type GaAs epitaxial layer 222. Using the mask 230 as an etching mask, the n-type GaAs epitaxial layer 222 is selectively etched to form the recesses 224 in the shape and dimensions discussed earlier. Refer to FIG. 15.

After forming a SiO$_2$ insulation layer 232 over the entire upper surface of the layer 222, including the slanted surfaces 226 of the recesses 224 and over the n-type GaAs at the bottoms of the recesses 224 (and after possible removal of the mask 230), the SiO$_2$, the insulation film 232 is patterned by etching to expose GaAs at the bottoms of the recesses 224. Using the patterned SiO$_2$ layer 232 as a diffusion mask, the GaAs exposed at the bottoms of the recesses 224 is doped, e.g., with Zn, to thereby form light-emitting portions 228 of p-type GaAs at the bottoms of the recesses 224. Refer to FIG. 16.

The remaining SiO$_2$ insulation film 232 is removed, and an Au/Cr film 236 is formed over the upper surface of the layer 222, including over the slanted surfaces 226 of the side walls of the recesses 224, the Au/Cr film 236, by first forming a Cr film and then an Au film over it using photolithography, the Au/Cr film 236 is patterned to leave a reflection film 236 of Au/Cr film only over the slanted surfaces 226 of the side walls of the recesses 224. Electrodes (not shown) are formed for supplying electric current to the light-emitting portion 228, to essentially complete the LED array 210 seen in FIG. 14.

Because in the fourth embodiment the reflection coefficient of the Au/Cr film 236 (FIG. 14) is greater than that of the GaAs at the slanted surface 226 of the n-type GaAs epitaxial layer 222 in the third embodiment (FIG. 7), the overall light utilizing efficiency can be further improved.

According to experimental results, it is believed that the structure of the fourth embodiment can improve overall light utilization efficiency by 50% compared with the known structures discussed earlier which use the light-emitting portion of LEDs but not recesses and a reflecting film as in the fourth embodiment described herein.

Further, the LED array structure of the fourth embodiment can be manufactured efficiently and precisely by methods such as described above, resulting in low manufacturing cost.

Fifth Embodiment

Figure 18:
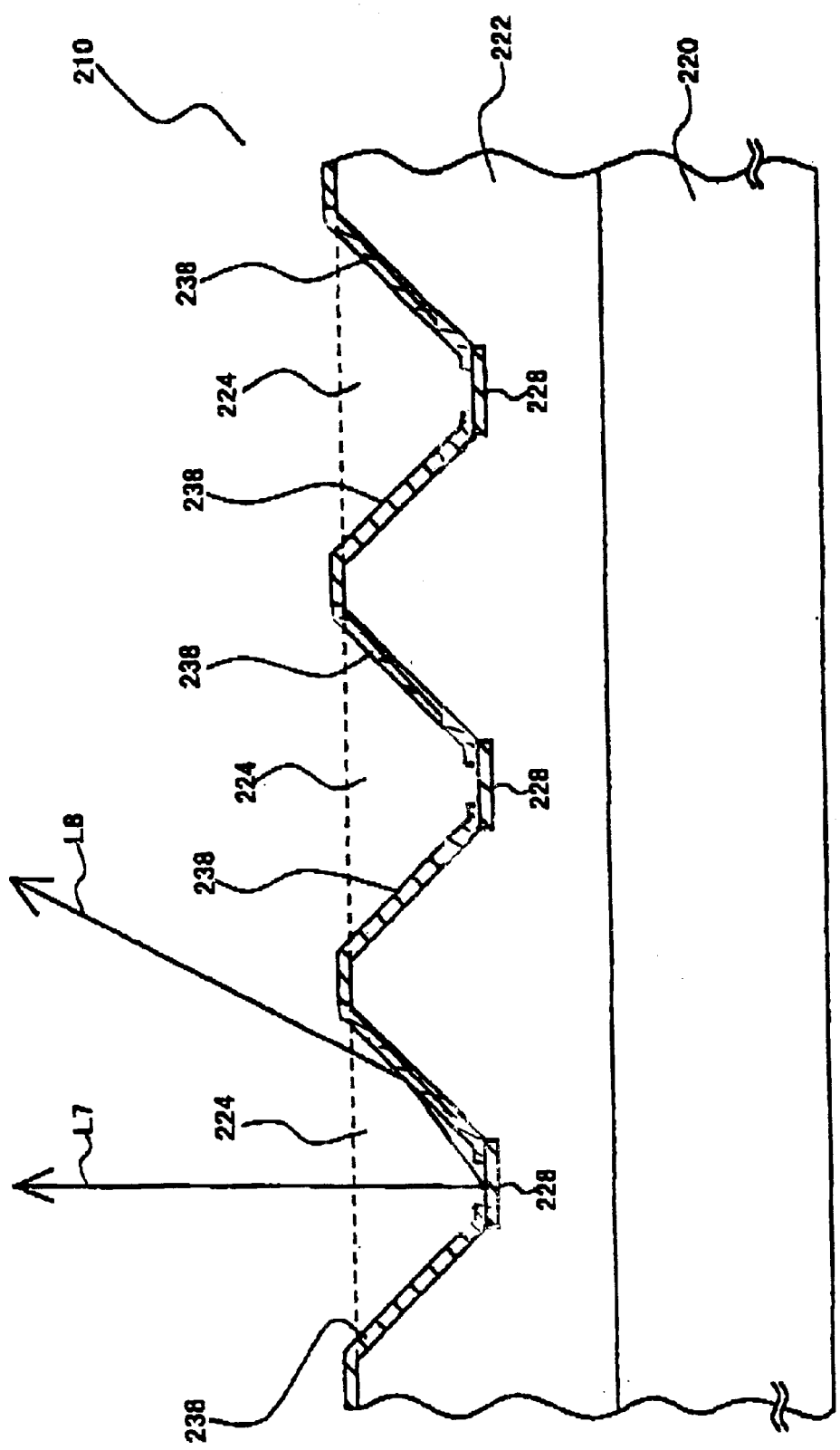
FIG. 18 is a cross-section illustrating an LED array of a fifth disclosed embodiment.
Figure 19:
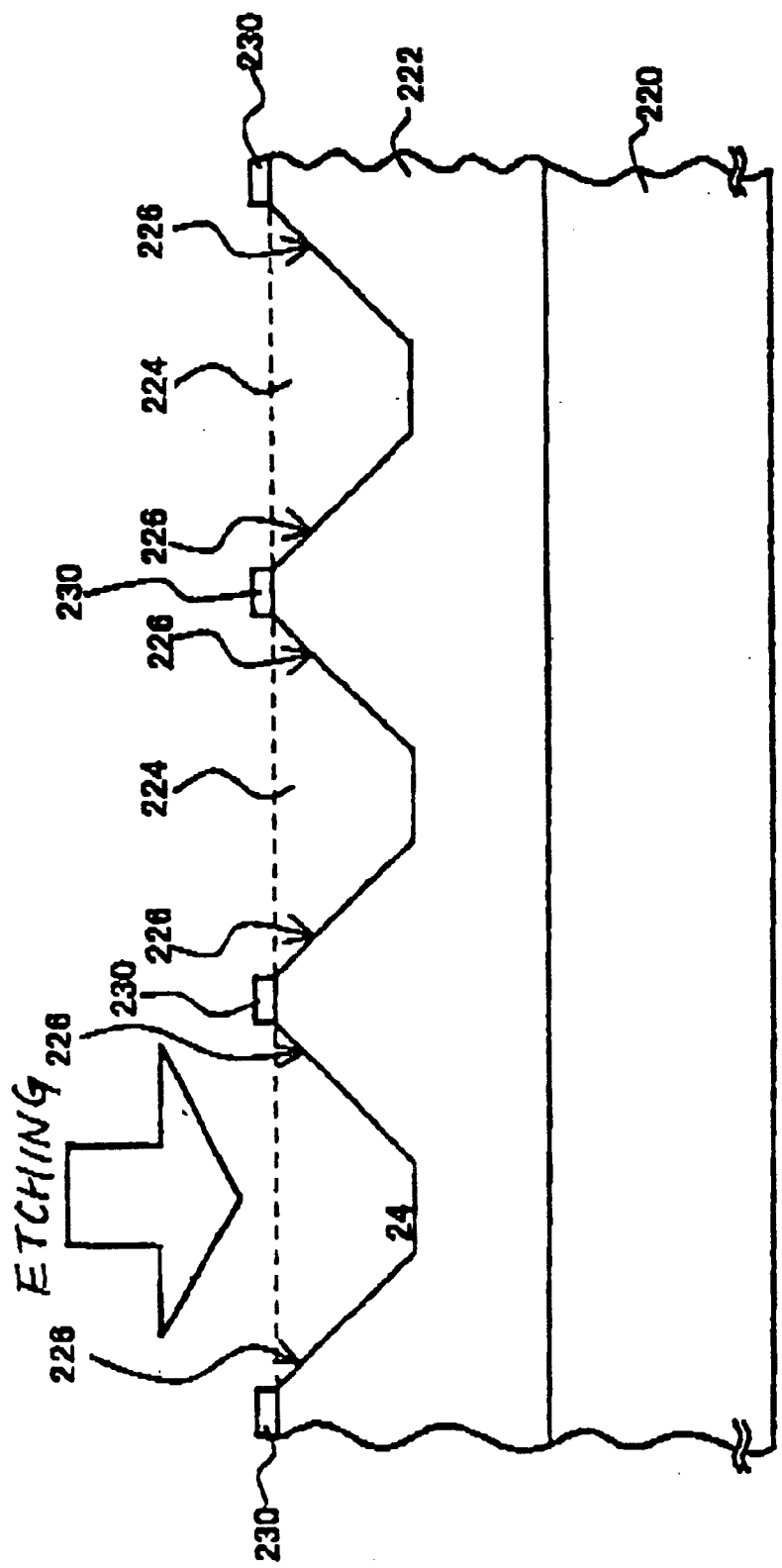
FIG. 19 is a cross-section illustrating a first step in the manufacture of the LED array of FIG. 18.
Figure 20:
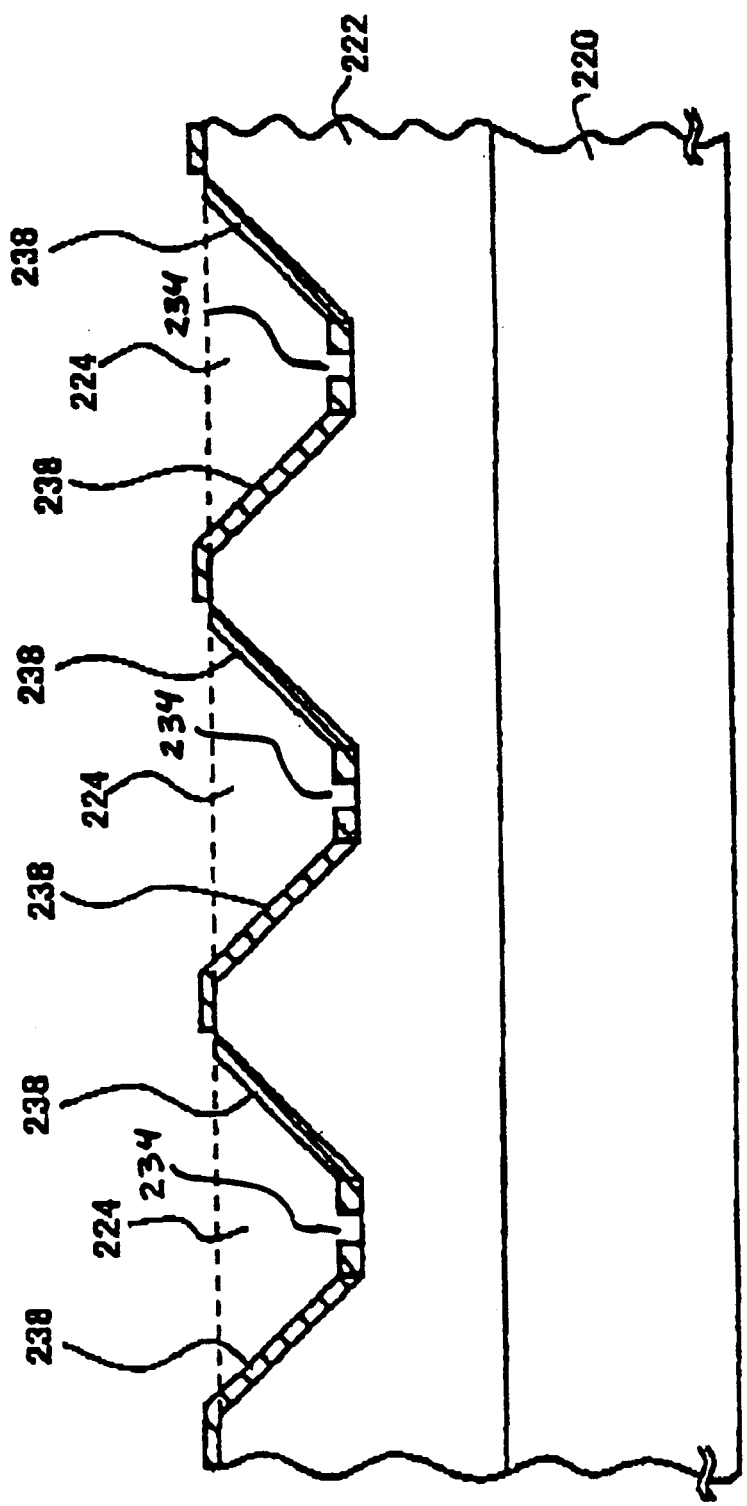
FIG. 20 is a cross-section illustrating a second step in the manufacture of the LED array of FIG. 18.
Figure 21:
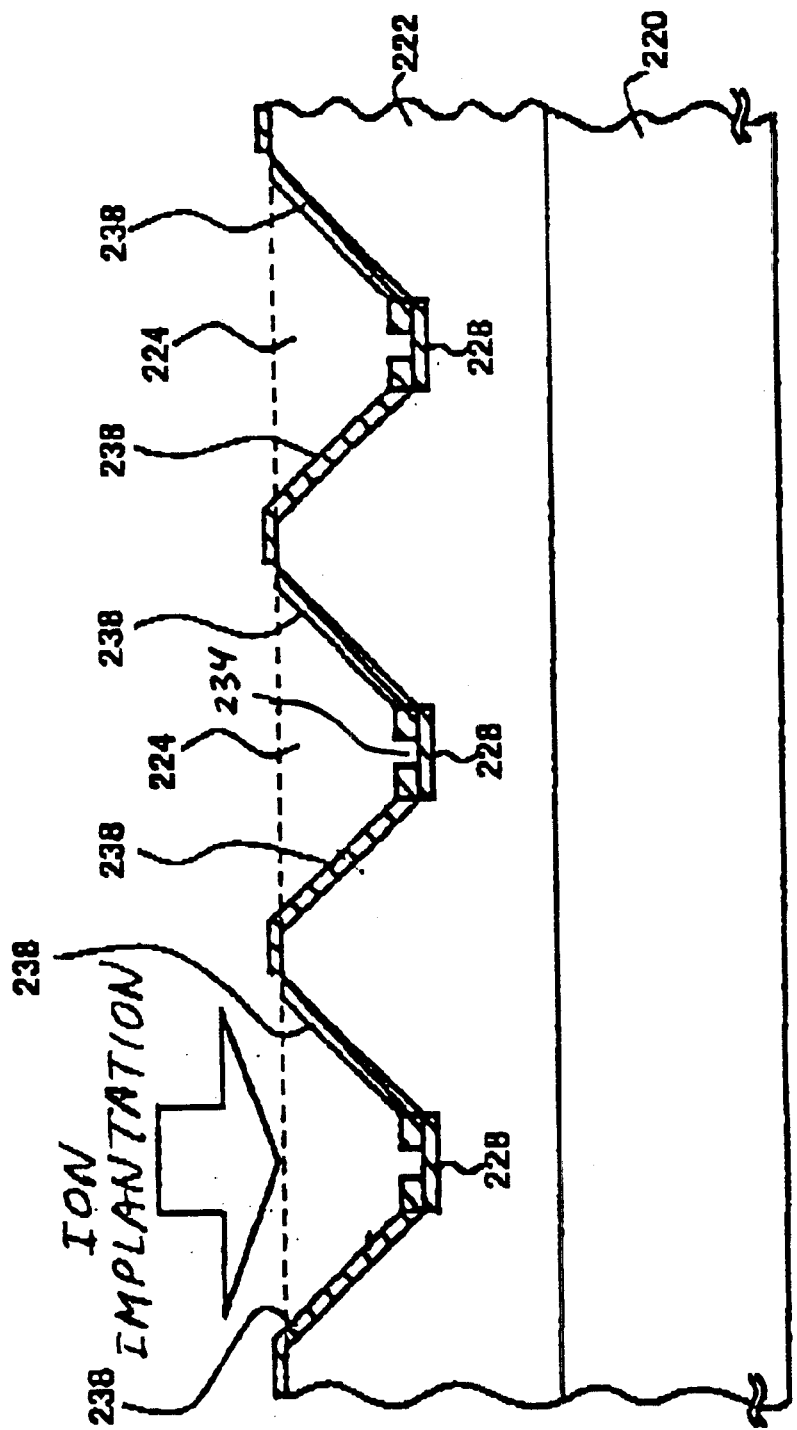
FIG. 21 is a cross-section illustrating a third step in the manufacture of the LED array of FIG. 18.
Figure 22:
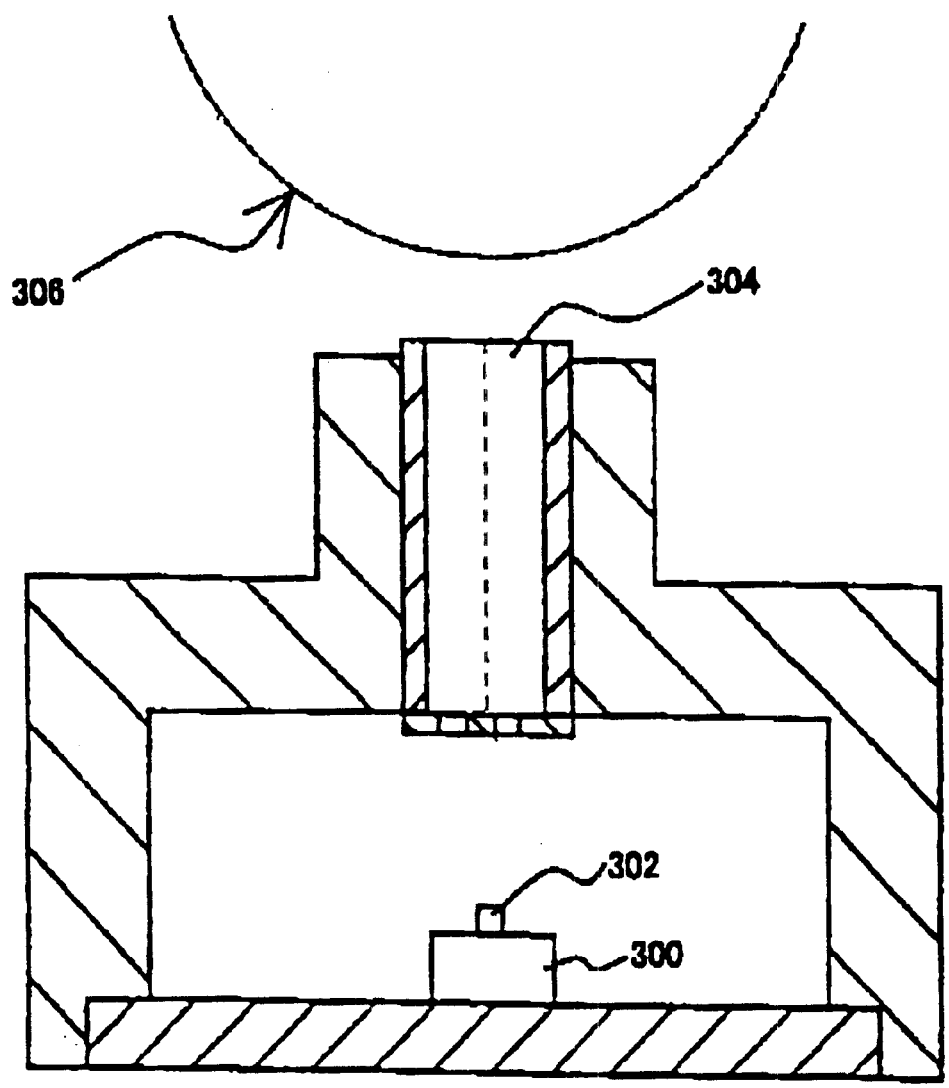
FIG. 22 is a cross-section illustrating a known apparatus employing the rod lens array.
Figure 23:
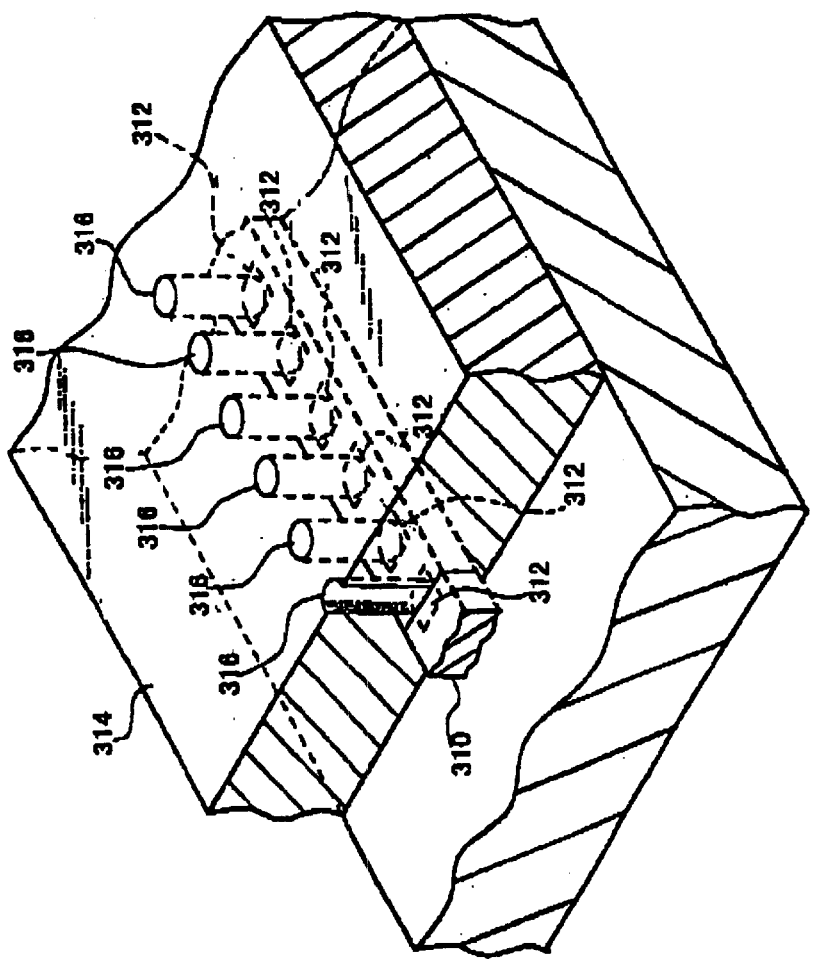
FIG. 23 is a perspective view illustrating a known optical apparatus using light guides.

FIG. 18 is a cross-section illustrating an LED array for use in an optical apparatus in accordance with a fifth embodiment, and FIGS. 19 through 21 illustrate steps in a method of manufacturing the LED array of FIG. 18.

As a non-limiting example, an optical apparatus using the fifth embodiment can be employed for writing-in optical information in a device such as an LED printer, as can an optical apparatus using the third embodiment. Because of the similarities with the third embodiment illustrated in FIG. 7, the same reference numerals are used for like elements in FIGS. 18–21 as in FIGS. 7 through 13, and the description thereof is not repeated here.

The structure of an LED array 210 in accordance with the fifth embodiment is described hereinafter.

As shown in FIG. 18, an n-type GaAs epitaxial layer 222 is formed over a GaAs substrate 220, and recesses 224 each in the shape of an inverted frustum (truncated cone) are formed into the n-type GaAs epitaxial layer 222. The bottom of each recess 224 preferably is circular and has a radius of 5 μm, the top of a recess 224 preferably is circular and has a radius of 10 μm, and the depth of a recess 224 preferably is 20 μm. Each recess 224 has a slanted side wall 226 in a vertical section. P-type GaAs portions (doped with Zn) are formed at the bottoms of the recesses 224 and preferably also are circular and have a radius of 5 μm. The p-type GaAs portions serve as light-emitting portions (LEDs) 228. A metal reflection film (Au/Cr film) 238 extends onto the periphery of the light-emitting portions 228 (and makes Ohmic contact therewith) and covers the slanted side walls 226 of the recesses 224 as well as the top portions of layer 222 that are between the recesses 224, to thereby serve both as a light reflection film and as an electrode supplying electrical current to the light-emitting portions 228. The Cr film is between the Au film and the GaAs layer 22 to improve bonding between the Au film that has a high reflection coefficient and the underlying n-type and p-type GaAs.

Next, the operation of the LED array 210 is described hereinafter.

As seen in FIG. 18, a light-emitting portion 228 emits toward a focusing system (not shown, but corresponding to system 212 of FIG. 7) both direct light L7 and indirect light L8 reflected by the Au/Cr film 238. Because of the size of the light-emitting portion 228, the light emitted therefrom can be considered diffused light emitted within a solid angle of 120° at the half-power width. The recess 224 limits this solid angle and the reflections of light L8 from the Au/Cr film 238 further concentrates the light from the corresponding light-emitting portion 228.

Next, a method of manufacturing the LED array 210 is described hereinafter, referring to the cross-sections of FIGS. 19 through 21.

After forming the n-type GaAs epitaxial layer 222 over the GaAs substrate 220, a mask 230 is patterned over the n-type GaAs epitaxial layer 222. Using the mask 230, the n-type GaAs epitaxial layer 222 is selectively etched to form the inverted frustum-shaped recesses 224 that preferably have circular bottoms of a 5 μm radius, tops of a 10 μm radius, and depth of 20 μm. Refer to FIG. 19.

An Au/Cr film 238 is formed over the entire upper surface of layer 222, by first forming the Cr film to improve bonding of the Au to GaAs. Using photolithography and selective etching, the Au/Cr film 238 is patterned to form openings 234 at the bottoms of the recesses 224 to thereby expose portions of the n-type GaAs centered with recesses 224. The openings are somewhat smaller in area than the bottom of the inverted frustum. Refer to FIG. 20.

Using the Au/Cr film 238 as a mask, the portions of layer 222 that are exposed through openings 234 are doped to p-type, e.g., through ion implantation with Zn, to thereby form light-emitting portions 228 serving as LEDs. Because the mask opening is smaller than the bottom of the recess 224, and because the p-type doping expands laterally due to various effects including heat activation, the Au/Cr film 238 comes into ohmic contact with the periphery of the p-type regions of the completed LEDs. The Au/Cr firm 238 thus serves as an electrode, as a metal reflection film, and as a bonding pad. Refer to FIG. 21.

The use of the recesses 224 and the reflection film 238 in the fifth embodiment improves the overall light utilization efficiency as compared with the known systems discussed above. In addition, the structure is simplified as compared with, for example, the fourth embodiment, because it is not necessary to provide an electrode and a bonding pad in addition to the Au/Cr film 238.

Furthermore, because the light-emitting portions 228 are formed by doping with Zn through openings 234 in the Au/Cr film at the bottoms of the recesses 224, the light-emitting portions 228 are in effect self-aligned with the recesses 224 and with the Au/Cr film 238 that serves as an electrode, a metal reflection film, and a bonding pad, and a doping mask. As a result, the relative positioning of the light-emitting portions 228 and the Au/Cr film 238 can be made very precise. Furthermore, since the light-emitting portions 228 and an electrode thereto are achieved through the same process of ion implanting Zn using the patterned Au/Cr as a mask, a manufacturing simplification is achieved.

The use of an LED array has been described in detail above, but it should be understood that an EL (electroluminescence) array can be used, such that EL devices are used in place of the LED devices.

Although one particular example of use of the LED arrays described above is in a system for writing-in optical information in an LED printer, the use of the LED arrays described in detail above is not so limited. For example, they can be used for writing-in optical information in digital copying machines, in facsimile devices, etc. or in other systems that utilize light beams of the type described above.

The recesses 224 have been described above as having the shape of an inverted frustum, but are not so limited. For instance, the recesses 224 can conform to the shape of a spherical or a spheroid, e.g., it can be arc-shaped in vertical section, or curved in some other way in vertical section to thereby reduce the solid angle of the light emitted from the LED or EC device. The inclination angle of the slanted side wall of the recess 224 can be selected so that the angle is different from that determined by the dimensions described above, and those dimensions can be selected to have different values, in order to optimize different aspects of the device, including light utilization efficiency.

In an example of the detailed description above, the SiO$_2$ insulation film 232 is used as a mask for the diffusion of Zn to form the light-emitting portions 228. It should be understood that this mask, or another mask, can be used for doping by another process, such as ion implantation.

Similarly, the Au/Cr film 238 can be used as a mask for diffusion of a dopant to form the p-type areas 228 rather than for ion implantation, or a mask of SiO$_2$ can be used for either diffusion or ion implantation.

On the contrary, in the aforementioned fifth embodiment, it is also allowed that, after forming the light-emitting portion 228 utilizing the impurities diffusion process, in which the SiO$_2$ insulation film, etc. is employed as the protection film, the Au/Cr film 238 is used.

The Au/Cr film 238 serving as a reflection film can be formed directly on the slanted surface 226 of the side wall of the recesses 224, or a film such as an insulation film of a material such as SiO$_2$ can be interposed between the GaAs layer 222 and the Au/Cr film 238.

Numerous other embodiments or modifications are possible in light of the above teachings. It is therefore to be understood that within the scope of the appended claims, the invention may be practiced otherwise than as specifically described herein.

Based on the full description provided herein, it will be apparent to one of ordinary skill in the art that many changes and modifications can be made thereto without departing from the spirit and scope of the invention claimed below.

This application is based on Japanese Patent Application No. JPAP09-248,088, filed on Sep. 12, 1997, and Japanese Patent Application No. JPAP09-333,599, the entire contents of both of which are herein incorporated by reference.

What is claimed is:

1. An optical apparatus for focusing light emitted from a light-emitting element array having plural light-emitting elements, onto a light-receiving surface through a focusing optical system, comprising:

a light beam narrowing structure integrally formed with said light-emitting element array and positioned between said array and said focusing optical system, a light-emitting portion of each said light-emitting element being below a bottom of said light beam narrowing structure; and said light beam narrowing structure narrowing a solid angle of light emitted from the individual light-emitting elements of said array by reflecting the emitted light toward said focusing optical system, wherein said light beam narrowing structure is shaped to limit a solid angle within which light from the light-emitting elements reaches the light receiving surface.

2. The optical apparatus for focusing light emitted from said light-emitting element array as defined in claim 1, wherein said light beam narrowing structure comprises reflection mirrors that are around respective individual light-emitting elements and reflect light therefrom toward said focusing optical system.

3. The optical apparatus for focusing light emitted from said light-emitting element array as defined in claim 2, wherein said light beam narrowing structure comprises focusing lenses that are aligned with respective individual light-emitting elements and focus light therefrom onto said focusing optical system.

4. The optical apparatus for focusing light emitted from said light-emitting element array as defined in claim 3, wherein said lenses are spherical lenses.

5. The optical apparatus for focusing light emitted from said light-emitting element array as defined in claim 3, wherein said reflection mirrors conform to the shape of an inverted conical frustum whose smaller diameter side faces said light-emitting elements and larger diameter side faces said focusing optical system.

6. The optical apparatus for focusing light emitted from said light-emitting element array as defined in claim 2, wherein said reflection mirrors conform to the shape of an inverted conical frustum whose smaller diameter side faces said light-emitting elements and larger diameter side faces said focusing optical system.

7. An optical apparatus for focusing light emitted from a light-emitting array having plural light-emitting elements, onto a light-receiving surface through a focusing optical system, comprising:

an angle narrowing structure formed integrally with said light-emitting array between said light-emitting elements and said focusing optical system, said angle narrowing structure comprising recesses aligned with respective light-emitting elements; light-emitting portions of said light-emitting elements being below bottoms of respective ones of said recesses;

said recesses being shaped to be relatively small at the light-emitting elements and to become progressively larger toward the focusing optical system; and wherein a part of light emitted from the light-emitting portions of said light-emitting elements reaches said focusing optical system as direct light and a part of the light emitted from the light-emitting portions of said light-emitting elements reaches the focusing optical system as indirect light that has been reflected from side walls of said recesses, wherein said recesses are shaped to limit a solid angle within which light from the light-emitting portions reaches the light receiving surface.

8. The optical apparatus for focusing light emitted from said light-emitting element array as defined in claim 7, including a metal reflection film formed on the side walls of said recesses to reflect light from said light-emitting elements to said focusing optical system.

9. The optical apparatus for focusing light emitted from said light-emitting element array as defined in claim 8, wherein said metal reflection film is in ohmic contact with said light-emitting elements and forms an electrode for supplying electric current thereto, in addition to serving to reflect light therefrom to said focusing optical system.

10. An optical apparatus for focusing light emitted from a light-emitting element array means having plural light-emitting elements, onto a light-receiving surface through a focusing optical system means, comprising:

a narrowing means integrally formed with said light-emitting element array means and positioned between said array means and said focusing optical system means, wherein a light-emitting portion of each said light-emitting element being below a bottom of said narrowing means; and said narrowing means narrowing a solid angle of light emitted from the individual light-emitting elements of said array means by reflecting the emitted light toward said focusing optical system means, wherein said narrowing means is shaped to limit a solid angle within which light from the light-emitting elements reaches the light receiving surface.

11. The optical apparatus for focusing light emitted from said light-emitting element array means as defined in claim 10, wherein said narrowing means comprises reflection mirror means around respective individual light-emitting elements, reflecting light therefrom toward said focusing optical system means.

12. The optical apparatus for focusing light emitted from said light-emitting element array means as defined in claim 11, wherein said narrowing means comprises focusing lens means aligned with respective individual light-emitting elements and focusing light therefrom onto said focusing optical system means.

13. The optical apparatus for focusing light emitted from said light-emitting element array means as defined in claim 12, wherein said lens means comprises spherical lenses.

14. The optical apparatus for focusing light emitted from said light-emitting element array means as defined in claim 12, wherein said reflection mirror means comprises mirror means conforming to the shape of an inverted conical frustum whose smaller diameter side faces said light-emitting elements and larger diameter side faces said focusing optical system means.

15. The optical apparatus for focusing light emitted from said light-emitting element array means as defined in claim 11, wherein said reflection mirror means comprises mirror means conforming to the shape of an inverted conical frustum whose smaller diameter side faces said light-emitting elements and larger diameter side faces said focusing optical system means.

16. An optical apparatus for focusing light emitted from light-emitting element array means having plural light-emitting elements, onto a light-receiving surface through a focusing optical system means, comprising:

a narrowing means formed integrally with said light-emitting array means between said light-emitting elements and said focusing optical system means, said narrowing means comprising recesses aligned with respective light-emitting elements;

light-emitting portions of said light-emitting elements being below bottoms of respective ones of said recesses;

said recesses being shaped to increase in area in moving from the light-emitting elements toward the focusing optical system means; and wherein a part of light emitted from the light-emitting portions of said light-emitting elements reaches said focusing optical system means as direct light and a part of the light emitted from the light-emitting portions of said light-emitting elements reaches the focusing optical system means as indirect light that has been reflected from side walls of said recesses, wherein said recesses are shaped to limit a solid angle within which light from the light-emitting elements reaches the light receiving surface.

17. The optical apparatus for focusing light emitted from said light-emitting element array means as defined in claim 16, including a metal reflection film formed on the side walls of said recesses to reflect light from said light-emitting elements to said focusing optical system means.

18. The optical apparatus for focusing light emitted from said light-emitting element array means as defined in claim 17, wherein said metal reflection film is in ohmic contact with said light-emitting elements and forms an electrode for supplying electric current thereto, in addition to serving to reflect light therefrom to said focusing optical system means.

19. A method of focusing light emitted from a light-emitting element array having plural light-emitting elements, onto a light-receiving surface through a focusing optical system, comprising the steps of:

providing a narrowing optical system that includes a reflection structure integral with said light-emitting element array, a light-emitting portion of each said light-emitting element being below a bottom of said narrowing optical system; and narrowing a solid angle of light emitted from said light-emitting element array by reflecting the emitted light toward said focusing optical system by using said reflection structure, wherein said narrowing optical system is shaped to limit a solid angle within which light from the light-emitting elements reaches the light receiving surface.

20. The method of focusing light emitted from said light-emitting element array as defined in claim 19, wherein said reflection structure includes reflection mirrors, said reflection mirrors surround respective ones of said light-emitting elements, and light emitted from said light-emitting elements reflects from said reflection mirrors before reaching said focusing optical system.

21. The method of focusing light emitted from said light-emitting element array as defined in claim 20, including providing focusing lenses for respective ones of said light-emitting elements to focus light emitted therefrom onto said focusing optical system.

22. The method of focusing light emitted from said light-emitting element array as defined in claim 21, including using spherical lenses as said focusing lenses.

23. The method of focusing light emitted from said light-emitting element array as defined in claim 21, comprising forming said reflection mirrors in the form of an inverted conical frustum, said reflection mirrors having a smaller opening facing said light-emitting elements and a larger opening facing said focusing optical system.

24. The method of focusing light emitted from said light-emitting element array as defined in claim 20, comprising forming said reflection mirrors in the form of an inverted conical frustum, said reflection mirrors having a smaller opening facing said light-emitting elements and a larger opening facing said focusing optical system.

25. A method of focusing light emitted from a light-emitting element array having plural light-emitting elements, onto a light-receiving surface through a focusing optical system comprising:

integrally forming light-emitting portions of said light-emitting elements at bottoms of respective recesses formed in a layer of a solid material forming a part of said light-emitting element array;

wherein said recesses are shaped such that they have openings increasing in size away from said light-emitting portions, and the light-emitting portions are below the bottom of said respective recesses; and delivering light emitted from said light-emitting portions to said focusing optical system both directly and indirectly, after reflection thereof from side walls of said recesses, wherein said recesses are shaped to limit a solid angle within which light from the light-emitting elements reaches the light receiving surface.

26. The method of focusing light emitted from said light-emitting element array as defined in claim 25, comprising providing a metal reflection film over said side walls of said recesses.

27. The method of focusing light emitted from said light-emitting element array as defined in claim 26, comprising using said metal reflection film both as an electrode for supplying electric current to the light-emitting portion of said light-emitting element and to reflect light from the light-emitting elements to the focusing optical system.

28. A method of selectively illuminating portions of a light receiving surface, comprising:

selectively energizing plural, spaced apart, individual light-emitting elements integrally formed in a semiconductor material substrate as an array of said elements, said energizing causing selected one of said elements to emit light; and collimating light emitted from the selected elements through plural openings in a collimating structure formed integrally with the array of elements, a light-emitting portion of the array of elements being provided below a bottom of the collimating structure, said openings being aligned with respective ones of said elements, extending from respective ones of said element toward said light receiving surface, and shaped to limit a solid angle within which light from the elements reaches the light receiving surface as direct light and as indirect light reflected from side walls of said openings.

29. A method as in claim 28 including providing a metal reflecting film over said side walls of said openings to cause indirect light from said elements to be reflected by said metal reflecting film before being delivered to said light receiving surface.

30. A method as in claim 29 including using said metal film as an electrode supplying electrical power to said elements.

31. A method as in claim 28 including providing at said openings an optically transparent solid material forming lenses aligned with said elements to focus light emitted therefrom.

32. A method as in claim 31 in which said forming of lenses comprises forming spherical lenses.

33. An optical system for selectively illuminating portions of a light receiving surface, comprising:

an array of light-emitting elements, light-emitting portions of which are integrally formed below bottoms of open-top recesses formed in a face of a semiconductor material;

said recesses providing respective reflective light paths from the light-emitting elements toward said light receiving surface and shaped to limit the solid angle within which light is delivered from said elements toward said light receiving surface to an angle substantially narrower than that in which light from said elements would have been delivered to the light receiving surface in the absence of the recesses.

34. An optical system as in claim 33 including an array of lenses integrally formed with said array, in the light paths from respective ones of said elements toward said light receiving surface, to help focus light from said elements onto said light receiving surface.

35. An optical system as in claim 34 in which said lenses are formed of solid, optically transparent material filling said recesses.

36. An optical system as in claim 33 including an oxide layer over said recesses and said elements.

37. An optical system as in claim 33 wherein said recesses have side walls surrounding the respective elements and including a metal reflecting film over said side walls, said metal reflecting film reflecting light from said elements toward said light receiving surface.

38. An optical system as in claim 37 in which said metal film supplies electrical power to said elements.

* * * * *